US007707386B2

(12) United States Patent
Kohno et al.

(10) Patent No.: US 7,707,386 B2
(45) Date of Patent: Apr. 27, 2010

(54) PROGRAM SEGMENT SEARCHING FOR EXTENSION INSTRUCTION DETERMINATION TO DESIGN A PROCESSOR THAT MEETS PERFORMANCE GOAL

(75) Inventors: Kazuyoshi Kohno, Kawasaki (JP);
Atsushi Mizuno, Yokohama (JP);
Atsushi Masuda, Yokohama (JP);
Ryuichiro Ohyama, Yokohama (JP);
Yutaka Ota, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 11/957,781

(22) Filed: Dec. 17, 2007

(65) Prior Publication Data
US 2008/0104365 A1    May 1, 2008

Related U.S. Application Data

(62) Division of application No. 11/044,085, filed on Jan. 28, 2005, now Pat. No. 7,337,301.

(30) Foreign Application Priority Data
Jan. 30, 2004    (JP)    ............. 2004-024499

(51) Int. Cl.
*G06F 17/50* (2006.01)
(52) U.S. Cl. .............. 712/36; 712/227; 716/1; 717/131; 717/151
(58) Field of Classification Search ............ None
See application file for complete search history.

(56) References Cited

U.S. PATENT DOCUMENTS 6,477,683 B1   11/2002   Killian et al.
6,634,017 B2   10/2003   Matsui et al.

(Continued)

FOREIGN PATENT DOCUMENTS

JP    04-175974    6/1992

(Continued)

OTHER PUBLICATIONS

Matsui, M. et al, "Design of LSI with Programming Langage-C for Digital Consumer Electronics (vol. 1)", Nikkei Electronics, Jul. 1, 2002, No. 825, pp. 170, 172, and 174-179, (in Japanese).

*Primary Examiner*—Kenneth S Kim
(74) *Attorney, Agent, or Firm*—Oblon, Spivak, McClelland, Maier & Neustadt, L.L.P.

(57) ABSTRACT

A design apparatus for designing a processor re-configurable for an application, includes an analysis unit that analyzes the content of a program to be executed by the processor; a hardware extension unit that searches the program for a part of the program allowing hardware extension in accordance with the analysis results by the analysis unit and generates hardware extension information for the searched part; an extended instruction definition unit that searches the program for a part allowing use of an extended instruction in accordance with the analysis results by the analysis unit and generates definition of an extended instruction for the searched part; and a performance estimation unit that estimates whether or not the performance of the processor satisfies a target performance using at least one of the hardware extension information generated by the hardware extension unit and the definition of the extended instruction generated by the extended instruction definition unit.

6 Claims, 38 Drawing Sheets

U.S. PATENT DOCUMENTS

| | | | |
|---|---|---|---|
| 6,941,548 B2 * | 9/2005 | Goodwin et al. | 717/151 |
| 7,171,632 B2 | 1/2007 | Masuda et al. | |
| 2005/0160402 A1 | 7/2005 | Wang et al. | |
| 2006/0195812 A1 * | 8/2006 | Nakajima | 716/18 |

FOREIGN PATENT DOCUMENTS

| | | |
|---|---|---|
| JP | 2003-241975 | 8/2003 |
| JP | 2003-288203 | 10/2003 |
| JP | 2003-316838 | 11/2003 |

* cited by examiner

FIG. 3

```
GENERATE A SET OF ALL FUNCTIONS F INCLUDED IN PROGRAM;              ······(0301)
GENERATE A SET OF ALL STATEMENTS S INCLUDED IN PROGRAM;             ······(0302)
DEFINE E AS AN EXTENSION METHOD AND INITIALIZE INTO A NIL SET;      ······(0303)
while (F != φ) {                                                    ······(0304)
 TAKE FUNCTION F HAVING A MAXIMUM NUMBER OF INSTRUCTIONS OUT OF F;  ······(0305)
   F = F ¥ {f};                                                     ······(0306)
   IF(EU{f} SATISFIES CONSTRAINTS){                                 ······(0307)
     E = E U {f};                                                   ······(0308)
     IF(EU{f} SATISFIES TARGET PERFORMANCE){                        ······(0309)
        break;                                                      ······(0310)
     }                                                              ······(0311)
   }                                                                ······(0312)
}                                                                   ······(0313)
while (S != φ) {                                                    ······(0314)
TAKE A STATEMENT S HAVING A MAXIMUM NUMBER OF INSTRUCTIONS OUT OF S; ······(0315)
   S = S ¥ {s};                                                     ······(0316)
   IF(EU{s} SATISFIES CONSTRAINTS){                                 ······(0317)
     E = E U {s};                                                   ······(0318)
     IF(EU{s} SATISFIES TARGET PERFORMANCE){                        ······(0319)
        break;                                                      ······(0320)
     }                                                              ······(0321)
   }                                                                ······(0322)
}                                                                   ······(0323)
return E;                                                           ······(0324)
```

FIG. 8

```
int func(int d) {                    ..... (0801)
  int a, b, c;                       ..... (0802)
  __cop int ca, cb;                  ..... (0803)

....

ca = a;                            ..... (0811)
  cb = b;                            ..... (0812)
  cadd(ca, cb);                      ..... (0813)
  c = (ca * d) >> 32;                ..... (0814)

| INSTRUCTION | DEFINITION OF OPERATION |
|---|---|
| CMOV(Rn, CRm) | Rn = CRm; |
| CMOV(CRn, Rm) | CRn = Rm; |
| CADD(CRn, CRm) | CRn = CRn + CRm; |
| CMULA(CRn, CRm) | ACC = CRn * CRm; |
| XMULA(Rn, Rm) | ACC = Rn * Rm; |
| CMOVH(Rn) | Rn = ACC[63:32]; |
| CMOVL(Rm) | Rn = ACC[31:0]; |

FIG. 10

```
cmov   $c1, $3        ..... (1001)
cmov   $c2, $5        ..... (1002)
cadd   $c1, $c2       ..... (1003)
cmov   $c15, $7       ..... (1004)
cmula  $c1, $c15      ..... (1005)
cmovh  $8             ..... (1006)
```

FIG. 11

```
__asm void cinst_0001(int c, __cop int ca, int d)      ·····(1101)
{                                                       ·····(1102)
  c = (ca * d) >> 32;                                   ·····(1103)
}                                                       ·····(1104)
```

FIG. 12

```
cmov       $c1, $3                ·····(1201)
cmov       $c2, $5                ·····(1202)
cadd       $c1, $c2               ·····(1203)
cinst_0001 $8, $c15, $7           ·····(1204)
```

FIG. 13

```
int f2(int a[], int x[])             ·····(1301)
{                                    ·····(1302)
  int i;                             ·····(1303)
  int tmp = 0;                       ·····(1304)
  for ( i = 0; i < 5; i++ )          ·····(1305)
    tmp += (a[i] + x[i]) / 2;        ·····(1306)

return (tmp);                      ·····(1307)
}                                    ·····(1308)
```

FIG. 14

```
lw    $4,0($9)           # load a[i]              ..... (1401)
lw    $10,0($11)          # load x[i]              ..... (1402)
add3  $12,$4,$10          # $12 = a[i]+x[i]        ..... (1403)
sra   $12,1              # $12 /= 2               ..... (1404)
add3  $6,$6,$12           # tmp += $12             ..... (1405)
```

FIG. 15

```
reg : 32 : dspreg;                                 ..... (1501)

__asm void dspst(int tmp)                          ..... (1511)
{                                                  ..... (1512)
  dspreg = tmp;                                    ..... (1513)
}                                                  ..... (1514)

__asm int dspld()                                  ..... (1521)
{                                                  ..... (1522)
  return (dspreg);                                 ..... (1523)
}                                                  ..... (1524)

__asm void dinst_0001(int a, int b)                ..... (1531)
{                                                  ..... (1532)
  dspreg += (a + b) / 2;                           ..... (1533)
}                                                  ..... (1534)
```

FIG. 16

```
lw       $4,0($9)         # load a[i]              .... (1601)
lw       $10,0($11)        # load x[i]              .... (1602)
dspinst  $4,$10           # dspreg += a[i]+x[i]    .... (1603)
```

FIG. 20

| ADDRESS | INSTRUCTIONS (MNEMONICS) |
|---|---|
| 0001 | LD   R1, 0x64 |
| 0002 | LD   R2, (0x4000) |
| 0003 | LD   R3, (0x4001) |
| 0004 | ADD R2, R3 |
| 0005 | LD   R3, (0x4002) |
| 0006 | JNZ R3, 000a |
| 0007 | ADD R2, R1 |
| 0008 | ADD R2, R1 |
| 0009 | JMP 000b |
| 000a | SUB R2, R3 |
| 000b | LD   (0x4000), R2 |
| 000c | SUB R1, 1 |
| 000d | JNZ R1, 0002 |
| 000e | ... |

FIG. 21

| ADDRESS | TYPE |
|---|---|
| 0001 | BRANCHING DESTINATION |
| 0006 | BRANCH |
| 0007 | BRANCHING DESTINATION |
| 000a | BRANCHING DESTINATION |
| 0009 | BRANCH |
| 000b | BRANCHING DESTINATION |
| 000d | BRANCH |
| 0002 | BRANCHING DESTINATION |
| 000e | BRANCHING DESTINATION |

FIG. 22

| ADDRESS | TYPE |
|---|---|
| 0001 | BRANCHING DESTINATION |
| 0002 | BRANCHING DESTINATION |
| 0006 | BRANCH |
| 0007 | BRANCHING DESTINATION |
| 0009 | BRANCH |
| 000a | BRANCHING DESTINATION |
| 000b | BRANCHING DESTINATION |
| 000d | BRANCH |
| 000e | BRANCHING DESTINATION |

FIG. 23

| INSTRUCTION BLOCK NUMBER | START ADDRESS | END ADDRESS |
|---|---|---|
| 0 | 0001 | 0001 |
| 1 | 0002 | 0006 |
| 2 | 0007 | 0009 |
| 3 | 000a | 000a |
| 4 | 000b | 000d |

FIG. 24

| INSTRUCTION BLOCK NUMBER | START ADDRESS | END ADDRESS | EXECUTION COUNT |
|---|---|---|---|
| 0 | 0001 | 0001 | 1 |
| 1 | 0002 | 0006 | 100 |
| 2 | 0007 | 0009 | 0 |
| 3 | 000a | 000a | 100 |
| 4 | 000b | 000d | 100 |

FIG. 26

```
unsigned  int f1(unsigned   int x[], unsigned   int y[]) {              ····(2601)
unsigned  int i, z;                                                     ····(2602)
z = (x[0] * y[0]) / 2 + 1;             /*   BASIC BLOCK 1 */            ····(2603)
for( i = 1; i < 8; i++)                /*   BASIC BLOCK 2 */            ····(2604)
   z += (x[i] * y[i]) / 2;             /*                 */            ····(2605)
return z;                              /*   BASIC BLOCK 3 */            ····(2606)
}                                                                       ····(2607)
```

FIG. 27

```
MULDIV2:       Rn,Rm:     // INSTRUCTION MNEMONIC AND OPERAND    ····(2701)
1111_nnnn _mmmm _0010 _0000 _0000 _0000 _0000:  // OPCODE         ····(2702)
<<< Rn = Rn* Rm/2; >>>                    // INSTRUCTION OPERATION ····(2703)
:UCI:::;                                  // OTHER SETTINGS       ····(2704)

MULDIVI:       Rn,Rm,Imm8:                                        ····(2711)
1111_nnnn _mmmm _0010 _1000 _0000 _iiii _iiii:                    ····(2712)
<<< Rn = Rn* Rm/2 + Imm8; >>>                                     ····(2713)
:UCI:::;                                                          ····(2714)
```

FIG. 28

| BASIC BLOCK | LINE NUMBER | ASSEMBLY CODE | MEANING | NUMBER OF INSTRUCTIONS FOR EACH BASIC BLOCK | EXECUTION COUNT FOR EACH BASIC BLOCK |
|---|---|---|---|---|---|
| 1 | 1 | f1: lw $11,0($2) | load y[0] | 6 | 1 |
| | 2 | lw $10,0($1) | load x[0] | | |
| | 3 | mulu $11,$10 | $11 = ($x[0] * y[0]$) | | |
| | 4 | srl $11,1 | $11 = $11/2 | | |
| | 5 | add $11,1 | z = $11 + 1 | | |
| | 6 | mov $10,1 | i = 1 | | |
| 2 | 7 | L1: add3 $0,$1,$10 | $0 = x[] + i | 9 | 7 |
| | 8 | lw $9,0($0) | load x[i] | | |
| | 9 | add3 $0,$2,$10 | $0 = y[] + i | | |
| | 10 | lw $4,0($0) | load y[i] | | |
| | 11 | mulu $9,$4 | $9 = x[i] * y[i] | | |
| | 12 | srl $9,1 | $9 = $9 / 2 | | |
| | 13 | add3 $11,$11,$9 | z = z + $9 | | |
| | 14 | addi $10,1 | i = i+1 | | |
| | 15 | blti $10,4,L1 | if(i<4) goto L1 | | |
| 3 | 16 | mov $0,$11 | SET VALUE THAT FUNCTION RETURNS | 2 | 1 |
| | 17 | ret | RETURN | | |

FIG. 29

| BASIC BLOCK | LINE NUMBER | ASSEMBLY CODE | MEANING | NUMBER OF INSTRUCTIONS FOR EACH BASIC BLOCK | EXECUTION COUNT FOR EACH BASIC BLOCK |
|---|---|---|---|---|---|
| 1 | 1 | f1: lw $11,0($2) | load y[0] | 4 | 1 |
|   | 2 | lw $10,0($1) | load x[0] | | |
|   | 3 | muldivi $11,$10,1 | $11=(x[0]*y[0])/2+1 | | |
|   | 4 | mov $10,1 | i=1 | | |
| 2 | 5 | L1: add3 $0,$1,$10 | $0 = x[] + i | 8 | 7 |
|   | 6 | lw $9,0($0) | load x[i] | | |
|   | 7 | add3 $0,$2,$10 | $0 = y[] + i | | |
|   | 8 | lw $4,0($0) | load y[i] | | |
|   | 9 | muldiv2 $9,$4 | $9 = (x[i] * y[i]) / 2 | | |
|   | 10 | add3 $11,$11,$9 | z = z + $9 | | |
|   | 11 | addi $10,1 | i = i+1 | | |
|   | 12 | blti $10,8,L1 | if(i<8) goto L1 | | |
| 3 | 13 | mov $0,$11 | SET VALUE THAT FUNCTION RETURNS | 2 | 1 |
|   | 14 | ret | RETURN | | |

FIG. 30

| BASIC BLOCK | LINE NUMBER | ASSEMBLY CODE | MEANING | NUMBER OF INSTRUCTIONS FOR EACH BASIC BLOCK | EXECUTION COUNT FOR EACH BASIC BLOCK |
|---|---|---|---|---|---|
| 1 | 1 | f1: lw $11, 0($2) | load y[0] | 4 | 1 |
|   | 2 | lw $10,0($1) | load x[0] | | |
|   | 3 | muldivi $11,$10,1 | $11=(x[0]*y[0])/2+1 | | |
|   | 4 | mov $10,1 | i = 1 | | |
| 2 | 5 | L1: add3 $0,$1,$10 | $0 = x[i] + i | 9 | 7 |
|   | 6 | lw $9,0($0) | load x[i] | | |
|   | 7 | add3 $0,$2,$10 | $0 = y[i] + i | | |
|   | 8 | lw $4,0($0) | load y[i] | | |
|   | 9 | mulu $9,$4 | $9 = x[i] * y[i] | | |
|   | 10 | srl $9,1 | $9 = $9 / 2 | | |
|   | 11 | add3 $11,$11,$9 | z = z + $9 | | |
|   | 12 | addi $10,1 | i = i + 1 | | |
|   | 13 | bllti $10, 8 ,L1 | if(i<8) goto L1 | | |
| 3 | 14 | mov $0,$11 | SET VALUE THAT FUNCTION RETURNS | 2 | 1 |
|   | 15 | ret | RETURN | | |

FIG. 31

| BASIC BLOCK | LINE NUMBER | ASSEMBLY CODE | | MEANING | NUMBER OF INSTRUCTIONS FOR EACH BASIC BLOCK | EXECUTION COUNT FOR EACH BASIC BLOCK |
|---|---|---|---|---|---|---|
| 1 | 1 | f1: lw | $11,0($2) | load y[0] | 6 | 1 |
|  | 2 | lw | $10,0($1) | load x[0] |  |  |
|  | 3 | mulu | $11,$10 | $11 = (x[0] * y[0]) |  |  |
|  | 4 | srl | $11,1 | $11 = $11 / 2 |  |  |
|  | 5 | add | $11,1 | z = $11 + 1 |  |  |
|  | 6 | mov | $10,1 | i = 1 |  |  |
| 2 | 7 | L1: add3 | $0,$1,$10 | $0 = x[] + i | 8 | 7 |
|  | 8 | lw | $9 ,0($0) | load x[i] |  |  |
|  | 9 | add3 | $0,$2,$10 | $0 = y[] + i |  |  |
|  | 10 | lw | $4,0($0) | load y[i] |  |  |
|  | 11 | muldiv2 | $9,$4 | $9 = (x[i] * y[i]) / 2 |  |  |
|  | 12 | add3 | $11,$11,$9 | z = z + $9 |  |  |
|  | 13 | addi | $10,1 | i = i + 1 |  |  |
|  | 14 | blti | $10, 8 ,L1 | if(i<8) goto L1 |  |  |
| 3 | 15 | mov | $0,$11 | SET VALUE THAT FUNCTION RETURNS | 2 | 1 |
|  | 16 | ret |  | RETURN |  |  |

FIG. 32

| | | | |
|---|---|---|---|
| MULDIV2: | Rn,Rm: | // INSTRUCTION MNEMONIC AND OPERAND | ···· (3201) |
| 1111nnnnmmmm00100000000000000000: | | // OPCODE | ···· (3202) |
| <<< Rn = Rn * Rm / 2; >>> | | // INSTRUCTION OPERATION | ···· (3203) |
| :UCI :::; | | // OTHER SETTINGS | ···· (3204) |

FIG. 34

```
unsigned int f1(unsigned  int x[], unsigned  int y[]) {
  unsigned  int i, z;                              ... (3401)
  z = (x[0] * y[0]) / 2 + 1;                       ... (3402)
  if(x[0] != 0) {                                  ... (3403)
    for( i = 1;  i < 8; i++)                       /* BASIC BLOCK 1 */  ... (3404)
      z += (x[ i] * y[ i]) / 2;                    /* BASIC BLOCK 2 */  ... (3405)
  }                                                ... (3406)
                                                   ... (3407)
  else {                                           ... (3408)
    for( i = 1;  i < 8; i++)                       /* BASIC BLOCK 3 */  ... (3409)
      z += max(x[i],y[i]) / min(n[i],y[i]);        ... (3410)
  }                                                ... (3411)
  return z;                                        /* BASIC BLOCK 4 */  ... (3412)
}                                                  ... (3413)
```

FIG. 35

```
// USER-DEFINED INSTRUCTION GROUP
MULDIV2:    Rn,Rm:                      // INSTRUCTION MNEMONIC AND OPERAND   ...  (3501)
1111_nnnn_mmmm_0010_0000_0000_****_0000;    // OPCODE                         ...  (3502)
<<<Rn = Rn * Rm / 2;>>>                 // INSTRUCTION OPERATION              ...  (3503)
:UCI:;;                                 // OTHER SETTINGS                     ...  (3504)

MAX3:       Rk,Rn,Rm:                                                         ...  (3511)
1111_nnnn_mmmm_0010_0000_0000_****_kkkk;                                      ...  (3512)
<<<Rk = ((Rn > Rm) ? Rn : Rm);>>>                                             ...  (3513)
:UCI:;;                                                                       ...  (3514)

MIN3:       Rk,Rn,Rm:                                                         ...  (3521)
1111_nnnn_mmmm_0010_0000_0000_****_kkkk;                                      ...  (3522)
<<<Rk = ((Rn > Rm) ? Rn : Rm);>>>                                             ...  (3523)
:UCI:;;                                                                       ...  (3524)
```

FIG. 36

| BASIC BLOCK | LINE NUMBER | ASSEMBLY CODE | MEANING | NUMBER OF INSTRUCTIONS FOR EACH BASIC BLOCK | EXECUTION COUNT FOR EACH BASIC BLOCK |
|---|---|---|---|---|---|
| 1 | 1 | _f1: lw $11,0($2) | load y[0] | 6 | 1 |
| | 2 | lw $10,0($1) | load x[0] | | |
| | 3 | muldiv2 $11,$10 | $11=(x[0]*y[0])/2 | | |
| | 4 | addi $11,1 | z=$11+1 | | |
| | 5 | mov $10,1 | i=1 | | |
| | 6 | beqz $11,L2 | if(x[0]==0) goto L2 | | |
| 2 | 7 | L1: add3 $0,$1,$10 | $0=x[]+i | 8 | 7 |
| | 8 | lw $9,0($0) | load x[i] | | |
| | 9 | add3 $0,$2,$10 | $0=y[]+i | | |
| | 10 | lw $4,0($0) | load y[i] | | |
| | 11 | muldiv2 $9,$4 | $9=(x[i]*y[i])/2 | | |
| | 12 | add3 $11,$11,$9 | z=z+$9 | | |
| | 13 | addi $10,1 | i=i+1 | | |
| | 14 | blti $10,8,L1 | if(i<8) goto L1 | | |
| | 15 | jmp L3 | goto L3 | | |
| 3 | 16 | L2: add3 $0,$1,$10 | $0=x[]+i | 10 | 7 |
| | 17 | lw $9,0($0) | load x[i] | | |
| | 18 | add3 $0,$2,$10 | $0=y[]+i | | |
| | 19 | lw $4,0($0) | load y[i] | | |
| | 20 | max3 $12,$9,$4 | $12=max(x[i],y[i]) | | |
| | 21 | min3 $13,$9,$4 | $13=min(x[i],y[i]) | | |
| | 22 | div $12,$13 | $12=$12/$13 | | |
| | 23 | add3 $11,$11,$12 | z=z+$12 | | |
| | 24 | addi $10,1 | i=i+1 | | |
| | 25 | blti $10,8,L2 | if(i<8) goto L2 | | |
| 4 | 26 | L3: mov $0,$11 | SET VALUE THAT FUNCTION RETURNS | 2 | 1 |
| | 27 | ret | RETURN | | |

FIG. 37

| INSTRUCTION BLOCK SET | BASIC BLOCK | USED USER-DEFINED INSTRUCTIONS |
|---|---|---|
| IB1 | 1,2 | muldiv2 |
| IB2 | 3 | min3,max3 |
| IB3 | 4 | NOTHING |

FIG. 38

| INSTRUCTION | DEFINED INSTRUCTION SUBSET | OPCODE |
|---|---|---|
| muldiv2 | U_IB1 | 1111_nnnn_mmmm_0010_0000_0000_****_0000 |
| max3 | U_IB2 | 1111_nnnn_mmmm_0010_0000_0000_****_kkkk |
| min3 | | 1111_nnnn_mmmm_0010_0000_0000_****_kkkk |
| AVAILABLE RANGE | | 1111_nnnn_mmmm_0010_0000_0000_0000_0000~ 1111_nnnn_mmmm_0010_0000_0000_0001_1111 |

FIG. 39

| INSTRUCTION | DEFINED INSTRUCTION SUBSET | OPCODE |
|---|---|---|
| muldiv2 | U_IB1 | 1111_nnnn_mmmm_0010_0000_0000_0000_0000 |
| max3 | U_IB2 | 1111_nnnn_mmmm_0010_0000_0000_0000_kkkk |
| min3 | | 1111_nnnn_mmmm_0010_0000_0000_0000_kkkk |
| AVAILABLE RANGE | | 1111_nnnn_mmmm_0010_0000_0000_0000_0000~ 1111_nnnn_mmmm_0010_0000_0000_0001_1111 |

FIG. 40

| BASIC BLOCK | LINE NUMBER | ASSEMBLY CODE | MEANING | NUMBER OF INSTRUCTIONS FOR EACH BASIC BLOCK | EXECUTION COUNT FOR EACH BASIC BLOCK |
|---|---|---|---|---|---|
| 1 | 1 | _f1: switchiss 1 | INSTRUCTION SUBSET  I_UB1 | 6 | 1 |
| | 2 | lw  $11,0($2) | load y[0] | | |
| | 3 | lw  $10,0($1) | load x[0] | | |
| | 4 | muldiv2 $11,$10 | $11=(x[0]*y[0])/2 | | |
| | 5 | addi $11,1 | z = $11 + 1 | | |
| | 6 | mov $10,1 | i = 1 | | |
| | 7 | beqz $11,L2 | if(x[0] == 0) goto L2 | | |
| 2 | 8 | L1: add3 $0,$1,$10 | $0 = x[] + i | 8 | 7 |
| | 9 | lw  $9,0($0) | load x[i] | | |
| | 10 | add3  $0,$2,$10 | $0 = y[] + i | | |
| | 11 | lw  $4,0($0) | load y[i] | | |
| | 12 | muldiv2 $9,$4 | $9 = (x[i] * y[i]) / 2 | | |
| | 13 | add3 $11,$11,$9 | z = z + $9 | | |
| | 14 | addi $10,1 | i = i + 1 | | |
| | 15 | blti $10,8,L1 | if(i < 8) goto L1 | | |
| | 16 | jmp L3 | goto L3 | | |
| 5 | 17 | L2: switchiss 2 | INSTRUCTION SUBSET  I_UB2 | 1 | 1 |
| 3 | 18 | L4: add3 $0,$1,$10 | $0 = x[] + i | 10 | 7 |
| | 19 | lw  $9,0($0) | load x[i] | | |
| | 20 | add3  $0,$2,$10 | $0 = y[] + i | | |
| | 21 | lw  $4,0($0) | load y[i] | | |
| | 22 | max3 $12,$9,$4 | $12 = max(x[i],y[i]) | | |
| | 23 | min3 $13,$9,$4 | $13 = min(x[i],y[i]) | | |
| | 24 | div $12,$13 | $12 = $12 / $13 | | |
| | 25 | add3 $11,$11,$12 | z = z + $12 | | |
| | 26 | addi $10,1 | i = i + 1 | | |
| | 27 | blti $10,8,L4 | if(i < 8) goto L4: | | |
| 4 | 28 | L3: mov $0,$11 | SET VALUE THAT FUNCTION RETURNS | 2 | 1 |
| | 29 | ret | RETURN | | |

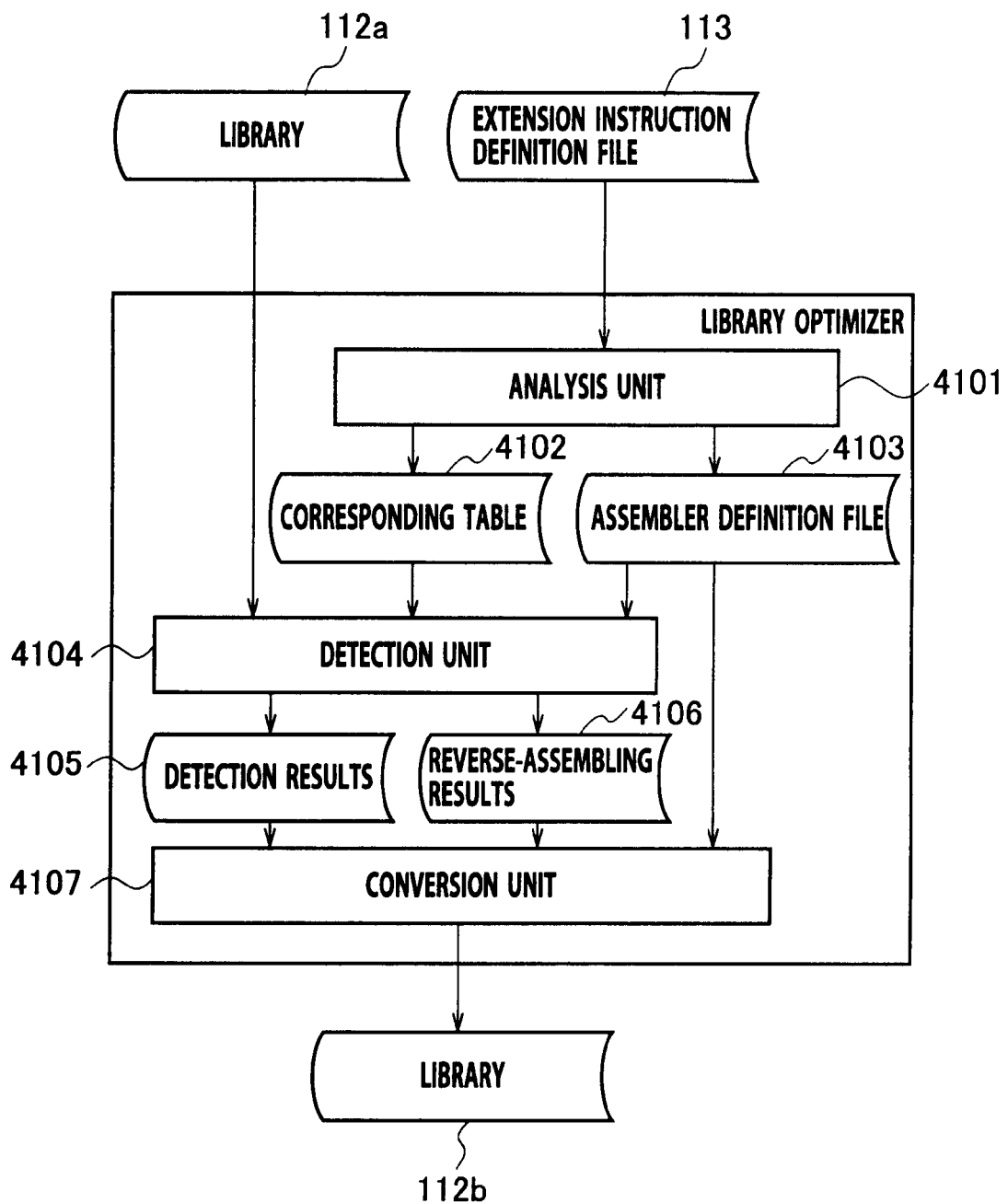

FIG. 45

```
#include <ctype.h>                        ···· (4401)
int atoi(const char *nptr)                ···· (4402)
{                                         ···· (4403)
int c;                                    ···· (4404)
int num;                                  ···· (4405)
for(;;) {                                 ···· (4406)
c = *nptr++;                              ···· (4407)
if (isdigit(c))                           ···· (4408)
num = num & 10 + (c - '0');               ···· (4409)
else                                      ···· (4410)
break;                                    ···· (4411)
}                                         ···· (4412)
return num;                               ···· (4413)
}                                         ···· (4414)
```

FIG. 46

| | | | |
|---|---|---|---|
| 0000 | _atoi: | | ···· (4501) |
| 000e D4rrrrrr | movu | $4,__ctype | ···· (4502) |
| 0012 | L50000: | | ···· (4503) |
| 0012 0B1C | lb | $11,0($1) | ···· (4504) |
| 0014 94BC | add3 | $12,$4,$11 | ···· (4505) |
| 0016 CACC0001 | lb | $10,1($12) | ···· (4506) |
| 001a 6104 | add | $1,1 | ···· (4507) |
| 001c C9A50004 | and3 | $9,$10,4 | ···· (4508) |
| 0020 A910 | beqz | $9,L5 | ···· (4509) |
| 0022 2007 | sl2ad3 | $0,$0,$0 | ···· (4510) |
| 0024 0C00 | mov | $12,$0 | ···· (4511) |
| 0026 C0B0FFD0 | add3 | $0,$11,-48 | ···· (4512) |
| 002a 6C0E | sll | $12,1 | ···· (4513) |
| 002c 90C0 | add3 | $0,$0,$12 | ···· (4514) |
| 002e BFE4 | bra | L50000 | ···· (4515) |
| 0030 | L5: | | ···· (4516) |
| 0030 7002 | ret | | ···· (4517) |

FIG. 47

```
DIGIT: Rn,Rm: 1111_nnnn_mmmm_0010_0000_0000_0000_0000:    ····(4601)
<<< Rn = (Rn * 10) + (Rm - '0'); >>>                      ····(4602)
UCI:"Insf=void"::                                         ····(4603)
;                                                         ····(4604)
```

FIG. 48

```
__asm void digit(int __reg_modify,int __reg_src);              ····(4701)
__asm void digit(int Rn,int Rm){ Rn = (Rn * 10) + (Rm - '0'); } ····(4702)

DIGIT Rn,Rm : "digit", T4RR, 0xf0020000                        ····(4801)
```

FIG. 49

| | | | |
|---|---|---|---|
| 0000 | _atoi: | | ···· (4801) |
| 000e D4rrrrrr | movu | $4,__ctype | ···· (4802) |
| 0012 | L50000: | | ···· (4803) |
| 0012 0B1C | lb | $11,0($1) | ···· (4804) |
| 0014 94BC | add3 | $12,$4,$11 | ···· (4805) |
| 0016 CACC0001 | lb | $10,1($12) | ···· (4806) |
| 001a 6104 | add | $1,1 | ···· (4807) |
| 001c C9A50004 | and3 | $9,$10,4 | ···· (4808) |
| 0020 A910 | beqz | $9,L5 | ···· (4809) |
| 0022 F0B20000 | digit | $0,$11 | ···· (4810) |
| 0026 C0B0FFD0 | xxxx | | ···· (4811) |
| 002a 6C0E | xxxx | | ···· (4812) |
| 002c 90C0 | xxxx | | ···· (4813) |
| 002e BFE4 | bra | L50000 | ···· (4814) |
| 0030 | L5: | | ···· (4815) |
| 0030 7002 | ret | | ···· (4816) |

FIG. 50

| | | | |
|---|---|---|---|
| 0000 | | _atoi: | ···· (4901) |
| 000e D4rrrrrr | | movu $4,__ctype | ···· (4902) |
| 0012 | | L50000: | ···· (4903) |
| 0012 0B1C | | lb $11,0($1) | ···· (4904) |
| 0014 94BC | | add3 $12,$4,$11 | ···· (4905) |
| 0016 CACC0001 | | lb $10,1($12) | ···· (4906) |
| 001a 6104 | | add $1,1 | ···· (4907) |
| 001c C9A50004 | | and3 $9,$10,4 | ···· (4908) |
| 0020 A908 | | beqz $9,L5 | ···· (4909) |
| 0022 F0B20000 | | digit $0,$11 | ···· (4910) |
| 0026 BFEC | | bra L50000 | ···· (4911) |
| 0028 | | L5: | ···· (4912) |
| 0028 7002 | | ret | ···· (4913) |
| 002a 6C0E | xxxx | | ···· (4914) |
| 002c 90C0 | xxxx | | ···· (4915) |
| 002e BFE4 | xxxx | | ···· (4916) |
| 0030 7002 | xxxx | | ···· (4917) |

FIG. 51

| | | | |
|---|---|---|---|
| 0000 | _atoi: | | ···· (5001) |
| 000e D4rrrrrr | movu | $4,__ctype | ···· (5002) |
| 0012 | L50000: | | ···· (5003) |
| 0012 0B1C | lb | $11,0($1) | ···· (5004) |
| 0014 94BC | add3 | $12,$4,$11 | ···· (5005) |
| 0016 CACC0001 | lb | $10,1($12) | ···· (5006) |
| 001a 6104 | add | $1,1 | ···· (5007) |
| 001c C9A50004 | and3 | $9,$10,4 | ···· (5008) |
| 0020 A908 | beqz | $9,L5 | ···· (5009) |
| 0022 F0B20000 | digit | $0,$11 | ···· (5010) |
| 0026 BFEC | bra | L50000 | ···· (5011) |
| 0028 | L5: | | ···· (5011) |
| 0028 7002 | ret | | ···· (5012) |
| 002a 0000 | nop | | ···· (5013) |
| 002c 0000 | nop | | ···· (5014) |
| 002e 0000 | nop | | ···· (5015) |
| 0030 0000 | nop | | ···· (5016) |

US 7,707,386 B2

PROGRAM SEGMENT SEARCHING FOR EXTENSION INSTRUCTION DETERMINATION TO DESIGN A PROCESSOR THAT MEETS PERFORMANCE GOAL

CROSS REFERENCE TO RELATED APPLICATIONS AND INCORPORATION BY REFERENCE

This application is a divisional of co-pending U.S. patent application Ser. No. 11/044,085, filed Jan. 28, 2005, and claims the benefit of priority from prior Japanese Patent Application P2004-024499 filed on Jan. 30, 2004, the entire contents of each of which are hereby incorporated herein by reference.

BACKGROUND OF THE INVENTION

1. Field of the Invention

The present invention relates to a design apparatus for a processor re-configurable for a target application, a design method for the same, and a library optimization method for the same. It particularly relates to a technique for automating extending hardware and defining extended instructions in a configurable-processor design phase.

2. Description of the Related Art

To design system LSIs such as the SoC (system on chip) in which a re-configurable processor capable of being added application-specific instructions is embedded, designers must design a source program for an algorithm to be used in a to-be-developed application system using a high level language such as C language and then carry out a high-level system simulation verifying whether or not a desired performance has been attained. If those verification results have not satisfied that desired performance, bottlenecks are then searched and identified. And an additionally extended instruction (user-defined instruction) is then defined, a region needing to be replaced with that extended instruction and/or a region needing to be replaced with specific hardware is selected, the present source program is re-written, and the system simulation is then carried out again, verifying whether or not that desired performance has been attained.

As a means to facilitate such series of operations, an apparatus that establishes a verification environment and a development tool (see Patent Application Laid-open No. 2002-230065) and an apparatus that aids a performance evaluation operation in the initial phase of an operation for distinguishing hardware sections from software sections (see Patent Application Laid-open No. 2000-57188), for example, are disclosed.

However, since most of the conventional operations for defining extended instructions, making a specification for an instruction set and selecting a source program region to be replaced with an extended instruction and/or a region to be replaced with specific hardware based on the analysis results, or related operations are manually carried out on a trial and error basis, those operations take a long time and a lot of work.

Moreover, since there are many selectable, extended-instruction definition methods and extending methods including usage of extended instructions and specific hardware, finding an optimal definition method and an extending method therefrom requires verification of each method, which takes a very long time and a lot of work.

Furthermore, there is a problem with the conventional verification method of carrying out system simulation and verifying whether or not a desired performance has been attained. Particularly, since conventional analysis of a program-based operation is made based on the execution count for each source program function and execution count for each instruction, comprehensive judgment cannot be made. This is because the analysis based on each function merely allows rough analysis of the operation while the analysis based on each instruction loses the relationship between adjacent instructions.

Furthermore, there are no tools for automatically generating an extended instruction set that is newly defined by a user, which may be useful to run a source program.

Yet furthermore, even though the source program may be optimized using a newly defined, extended instruction, libraries to be used to compile the source program cannot be optimized.

SUMMARY OF THE INVENTION

A first aspect of the present invention inheres in a design apparatus for designing a processor re-configurable for an application, including: (A) an analysis unit that analyzes the content of a program to be executed by the processor; (B) a hardware extension unit that searches the program for a part allowing hardware extension in accordance with the analysis results by the analysis unit and generates hardware extension information for the searched part; (C) an extended instruction definition unit that searches the program for a part allowing use of an extended instruction in accordance with the analysis results by the analysis unit and generates definition of an extended instruction for the searched part; and (D) a performance estimation unit that estimates whether or not the performance of the processor satisfies a target performance using at least one of the hardware extension information generated by the hardware extension unit and the definition of the extended instruction generated by the extended instruction definition unit.

A second aspect of the present invention inheres in a configurable processor design apparatus, which includes an analysis unit that analyzes the content of a program to be executed by a processor re-configurable for an application and an extended instruction definition unit that searches the program for a part allowing use of an extended instruction in accordance with the analysis results by the analysis unit and generates definition of an extended instruction for the searched part; said configurable processor design apparatus comprising a library optimizer that optimizes a library used for compiling the program; wherein said library optimizer includes: (A) an analyzer that analyzes an instruction sequence for the processor suitable for an extended instruction defined in that definition; (B) a detection unit that determines based on the analysis results by the analyzer whether or not there is the instruction sequence in binary codes of the library; and (C) a binary conversion unit that optimizes the binary codes of the library in accordance with the determination results by the detection unit.

A second aspect of the present invention inheres in a computer-aided design method of designing a processor reconfigurable for an application and satisfying a target performance for the processor, comprising: (A) analyzing the content of a program to be executed by the processor; (B) searching the program for a part allowing hardware extension in accordance with the analysis results and generating hardware extension information of the searched part; (C) searching the program for a part allowing use of an extended instruction in accordance with the analysis results and generating definition of an extended instruction for the searched part; and (D) estimating whether the performance of the processor satisfies a target performance when using at least one of the generated hardware extension information and the generated definition of the extended instruction.

A third aspect of the present invention inheres in a design method satisfying a target performance for the processor which is re-configurable for an application, the design method comprising: (A) inputting a program to be executed by the processor and analyzing the content of the inputted program; (B) searching the program for a part allowing hardware extension in accordance with the analysis results and generating hardware extension information of the searched part; (C) searching the program for a part allowing use of an extended instruction in accordance with the analysis results and generating definition of an extended instruction for the searched part; and (D) estimating based on at least one of the generated definition of the extended instruction and the generated hardware extension information whether or not the performance of the processor satisfies a target performance.

BRIEF DESCRIPTION OF THE DRAWINGS

FIG. 3 shows an exemplary procedure represented by pseudo-codes for extended instruction use and/or hardware extension;

FIG. 8 shows an exemplary source program, which is input to the extended instruction definition unit shown in FIG. 6;

FIG. 9 shows exemplary defined instructions for a coprocessor prior to extended instruction use;

FIG. 10 exemplifies assembly codes, which are the results of compiling the source program shown in FIG. 6;

FIG. 11 shows an exemplary defined extended instruction script generated by an instruction script generation unit;

FIG. 12 shows exemplary results of compiling the source program shown in FIG. 8 using a compiler after addition of extended instructions;

FIG. 13 shows an exemplary source program, which is input to the extended instruction definition unit shown in FIG. 6;

FIG. 14 shows exemplary assembly codes, which are the results of compiling the program shown in FIG. 13 using an instruction set without extended instructions;

FIG. 15 shows an exemplary defined extended instruction script generated by the instruction script generation unit;

FIG. 16 shows exemplary assembly codes, which are the results of compiling the program shown in FIG. 13 using extended instructions;

FIG. 20 shows an exemplary instruction sequence, which is input to the dynamic analysis unit shown in FIG. 17;

FIG. 21 shows exemplary branch convergence information output from a branch instruction search unit in the instruction sequence division unit shown in FIG. 17;

FIG. 22 shows exemplary results of sorting the branch convergence information shown in FIG. 21 in address order;

FIG. 23 shows exemplary instruction block information output from a branch block generation unit in the instruction sequence division unit shown in FIG. 18;

FIG. 24 shows an exemplary instruction block execution count output from an instruction block execution count calculation unit shown in FIG. 18;

FIG. 26 shows an exemplary source program, which is input to the design apparatus shown in FIG. 25;

FIG. 27 shows an exemplary user-defined instruction group, which is input to the design apparatus shown in FIG. 25;

FIG. 28 shows exemplary results of compiling the program in FIG. 26 without using the user-defined instruction group shown in FIG. 27;

FIG. 29 shows exemplary results of compiling the program in FIG. 26 using the user-defined instruction group shown in FIG. 27;

FIG. 30 shows an example of an assembly code A<muldivi> derived from a user-defined instruction group U_I;

FIG. 31 shows an example of an assembly code A<muldiv2> derived from a user-defined instruction group U_2;

FIG. 32 shows an exemplary defined instruction set output from an instruction set generation unit;

FIG. 34 shows an exemplary source program, which is input to the design apparatus shown in FIG. 33;

FIG. 35 shows an exemplary user-defined instruction group, which is input to the design apparatus shown in FIG. 33;

FIG. 36 shows exemplary results of compiling the program shown in FIG. 34 using the user-defined instruction group shown in FIG. 35;

FIG. 37 shows an exemplary instruction block set divided by a program division unit;

FIG. 38 shows exemplary user-defined instructions and opcodes (including undefined codes);

FIG. 39 shows exemplary user-defined instructions and opcodes (already assigned codes);

FIG. 40 shows exemplary assembly codes wherein some thereof are replaced with defined instruction subsets;

FIG. 41 shows an exemplary configuration of a library optimizer according to the fifth embodiment;

FIG. 45 shows an exemplary function registered in a library optimized by the library optimizer shown in FIG. 41;

FIG. 46 shows an exemplary binary script for the function shown in FIG. 41;

FIG. 47 shows an exemplary extended instruction definition file, which is input to the library optimizer shown in FIG. 41;

FIG. 48 shows an exemplary assembler definition file and a C language header file, which are input to the library optimizer shown in FIG. 41 from the outside;

FIG. 49 shows exemplary library data converted by the library optimizer;

FIG. 50 shows exemplary codes shifted for filling the gap in the library data shown in FIG. 49; and FIG. 51 shows exemplary 'nop' instructions filled in a new gap developed by the shifting process shown in FIG. 50.

DETAILED DESCRIPTION OF EMBODIMENTS

Figure 1:
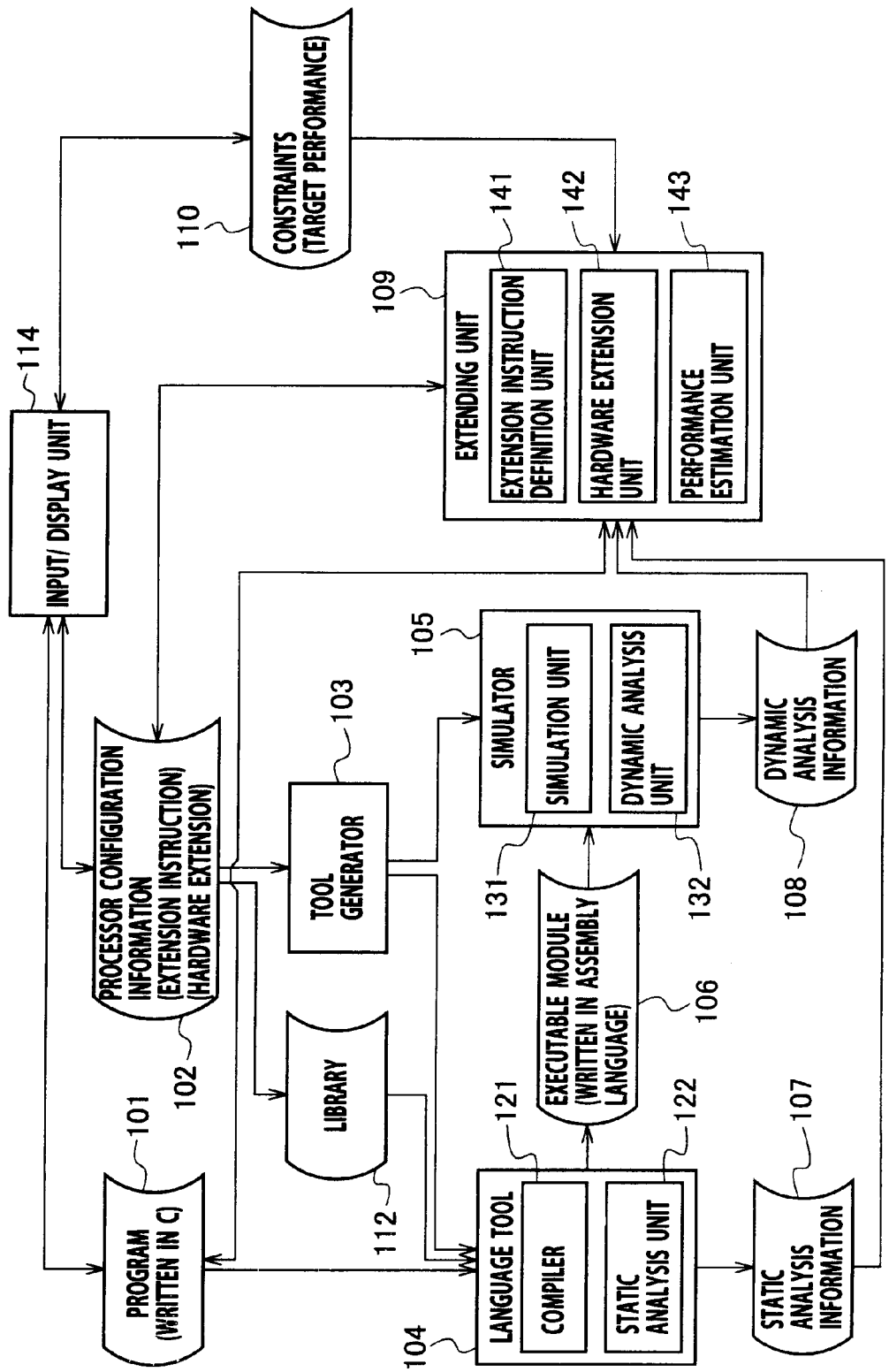
FIG. 1 shows an exemplary configuration of a re-configurable processor design apparatus according to the first embodiment.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific instruction values, etc. to provide a thorough understanding of the present invention. However, it will be obvious to those skilled in the art that the present invention may be practiced without such specific details.

First Embodiment

As shown in FIG. 1, the design apparatus according to the first embodiment includes a tool generator 103, a language tool 104, a simulator 105, an extending unit 109, an input/display unit 114 and related units.

The tool generator 103 is a development environment generation tool for a re-targetable or configurable processor, which receives processor configuration information 102 and then generates, for example, the language tool 104, a library 112, and the simulator 105 using the inputted processor configuration information 102. The processor configuration information 102 includes information of definition of extended instructions and hardware extension information.

The language tool 104 has a compiler 121 and a static analysis unit 122. The compiler 121 inputs a program 101 written in a certain language such as C language and then compiles it into a simulator 105-executable module 106 (assembly language). The program 101 describes an entire algorithm or a part thereof to be executed by a to-be-designed processor. The static analysis unit 122 includes a parser, which parses a C language based program, and outputs as static analysis information 107, a syntactic tree, the data flow analysis results, the looping analysis results, and the variable's lifetime analysis results, for example.

The simulator 105 has a simulation unit 131 and a dynamic analysis unit 132. The simulation unit 131 carries out simulation using the executable module 106 generated by the language tool 104. The dynamic analysis unit 132 carries out profiling, namely, analyzing the execution information for each function, statement, and instruction, and then outputting the results as dynamic analysis information 108.

The extending unit 109 includes an extended instruction definition unit 141, a hardware extension unit 142, and a performance estimation unit 143. The extended instruction definition unit 141 searches the program 101 for a region needing to be exchanged with an extended instruction using the static analysis information 107 and the dynamic analysis information 108, and generates a definition of the extended instruction for that region. The hardware extension unit 142 searches the program 101 for a region needing to be subjected to hardware extension using the static analysis information 107 and the dynamic analysis information 108, and then generates hardware extension information for that region. The definitions of the extended instruction generated by the hardware extension unit 141 and the hardware extension information generated by the hardware extension unit 142 are reflected in the processor configuration information 102. When having carried out hardware extension, the result thereof is reflected in the program 101 (written in C). The performance estimation unit 143 estimates whether or not the performance of a target processor may reach a target performance using both or either of the definition of extended instructions generated by the extended instruction definition unit 141 and the hardware extension information generated by the hardware extension unit 142. In other words, the performance estimation unit 143 is given a target performance (a target function and a target value) with certain constraints 110, and searches the function space for a point satisfying that target value (which represents a combination of the hardware extension method and the definition of an extended instruction). The target function may be the execution speed for the program 101, for example.

The extended instruction definition unit 141 and the hardware extension unit 142 may be able to use externally provided constraints 110. The constraints 110 limit the search domain to be searched by the performance estimation unit 143. The constraints 110 may be for the number of gates, code size, and power consumption, for example.

Figure 2:
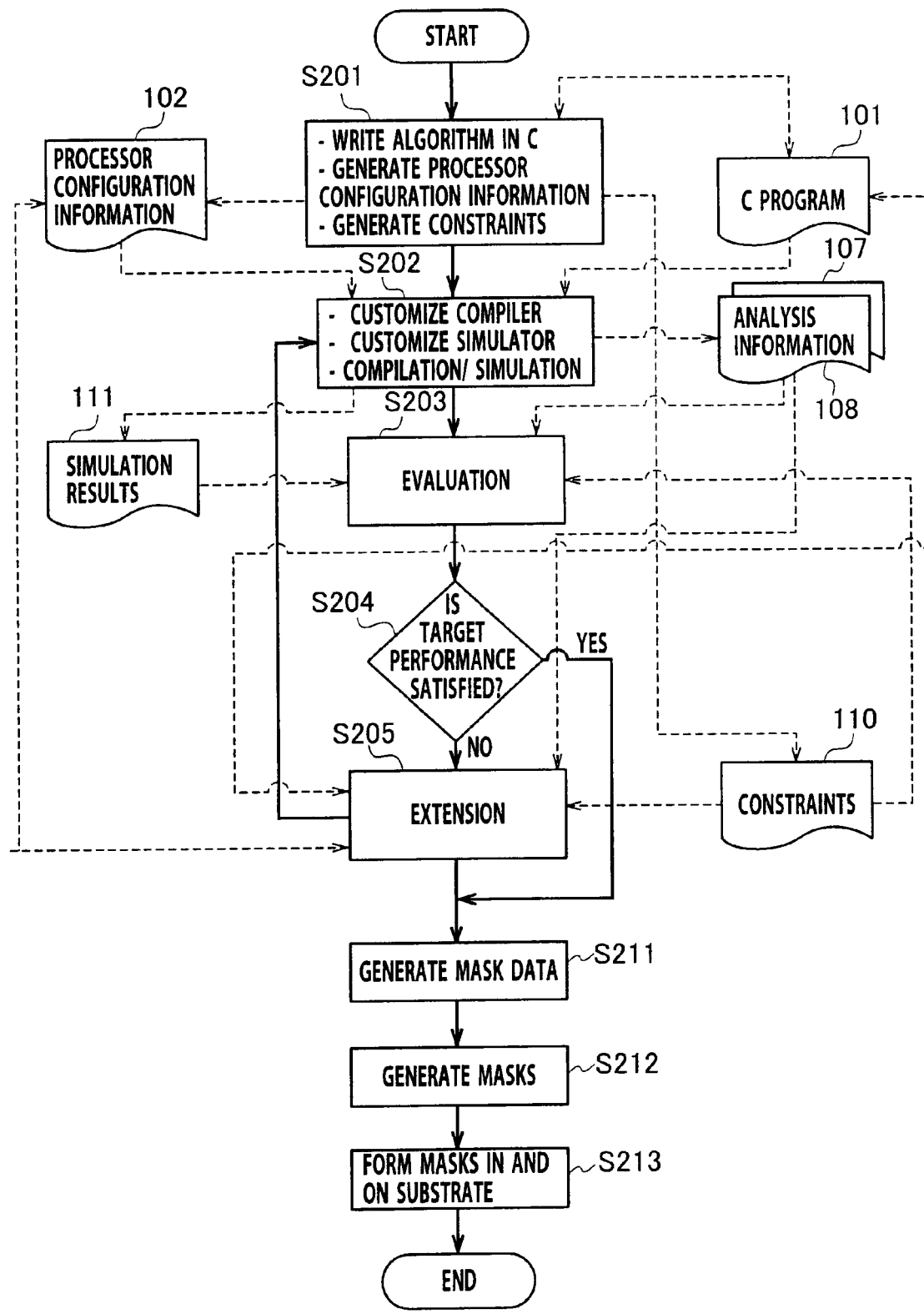
FIG. 2 is a flowchart exemplifying a design procedure by the design apparatus shown in FIG. 1.

FIG. 2 shows an exemplary procedure for designing certain software, which is executed by certain hardware or a processor including a configurable processor.

This example of the procedure for designing to be explained forthwith aims to provide a to-be-designed processor executing the program 101 at a speed of less than or equal to a predetermined reference value.

In step S201, an algorithm to be executed by a processor is written in C into the program 101, which is then input via the input/display unit 114. The processor configuration information 102 is then generated via the input/display unit 114. Moreover, the constraints 110 for limiting extension (hardware extension and use of extended instructions) and the target performance for a processor are generated via the input/display unit 114. These pieces of information may be generated using an editor or the like, or may be generated by inputting a value for each of necessary items while displaying those necessary items using GUI.

Next, in step S202, the tool generator 103 generates (customizes) the language tool 104 and the simulator 105 in accordance with the processor configuration information 102. The compiler 121 in the generated language tool 104 compiles the program 101, converting it to the executable module 106. The static analysis unit 122 in the language tool 104 outputs static analysis information 107 using syntax analysis information obtained from the program 101 compiled results. The dynamic analysis unit 132 uses an assembly language program and/or program analysis information generated as the static analysis information 107 by the compiler 121. The program analysis information includes loop information with the number of looping nests for each of statements comprising a C language based program, the number of instructions comprising each function, and the size of external data and codes that each function uses, for example.

The simulation unit 131 carries out simulation using the executable module 106 generated by the language tool 104, and the dynamic analysis unit 132 then analyzes the simulation execution results, outputting dynamic analysis information 108. The dynamic analysis unit 132 uses the profile information generated by the simulation unit 131 as the dynamic analysis information 108. More specifically, the profile information such as the count of calling each function, each statement execution count and each instruction execution count, and a ratio of the instruction execution count for each function to instruction execution count for the entire program 101 is output.

Next, in step S203, the performance estimation unit 143 in the extending unit 109 carries out evaluation using the static analysis information 107 and the dynamic analysis information 108. The dynamic analysis information 108 includes an executed instruction count and the number of executed cycles, for example. A program 101 processor execution speed is estimated using these pieces of information. In step S204, whether or not the program 101 processor execution speed has reached a predetermined target performance, which is given in the constraints 110, is determined. In the case of a code size being given in the constraints 110, it is compared with a code size included in the static analysis information 107, which allows determination of whether or not the constraints 110 are satisfied.

If the estimated execution speed satisfies the predetermined target performance, and the constraints 110 are also satisfied, this program proceeds to semiconductor fabrication steps beginning with step S211.

Otherwise, if the estimated execution speed does not satisfy the predetermined target performance, and the constraints 110 are also not satisfied, this program proceeds to step S205 in which the extended instruction definition unit 141 and the hardware extension unit 142 carry out use of extended instructions and hardware extension, thereby changing the processor architecture so that the constraints 110 and the target performance can be satisfied. More specifically, multiple instructions in the program 101, for example, are represented by an additional, newly defined single instruction, the defined single instruction is used in the program 101 (extended instruction use), and/or a partial software process in the program 101 is replaced with a dedicated hardware (hardware extension), thereby improving the execution speed of the entire processor. Since this hardware extension is carried out for a certain organized process (e.g., a function), a further improved performance than that in the case of extended instruction use may be provided.

That extension processing by the extending unit 109 can be regarded as dealing with an optimal extension method search problem of searching for an optimal extension method from a variety of methods for use of extended instructions and hardware extension. In the following, the case of searching using the static analysis information 107 and the case of searching using the dynamic analysis information 108 are described. A variety of algorithms for solving such search problem have been proposed, and the so-called Greedy algorithm is selected from them herein.

First, the case of using the static analysis information 107 is detailed. FIG. 3 shows an extending procedure represented by pseudo-codes. Processing from lines 0303 and 0313 in FIG. 3 identifies a bottleneck function in the program 101 (i.e., a function including the greatest number of instructions) using the static analysis information 107, and then selects an extension method satisfying the constraints 110 and a target performance for the identified function. Similarly, processing from lines 0314 and 0323 identifies a bottleneck statement in the program 101 (i.e., a statement including the greatest number of instructions) using the static analysis information 107, and then selects an extension method satisfying the constraints 110 and the target performance for the identified statement.

Replacement of a software process in the program 101 with dedicated hardware leads to increase in the number of gates, and the degree of increase in the number of gates may be evaluated using a high-level synthesis tool. When the number of gates is given as the constraints 110, usage of this information allows determination of whether or not the constraints 110 are satisfied. For a function to reference external data, that data needs to be transferred to a dedicated hardware before the referencing starts and transferred to a processor after the referencing ends. When selecting a function, consideration of that information allows an exact evaluation of the processor performance.

To search for an optimal extension method using the dynamic analysis information 108, the simulator 105 references the profiling results obtained by carrying out simulation. This allows acquisition of the ratio of the number of executed instructions in each function of the program 101 to number of executed instructions in the entire program 101. Functions with high ratios can be candidates for hardware extension or extended instruction use. Note that usage of both the static analysis information 107 and the dynamic analysis information 108 allows search for an optimal extension method. Moreover, in addition to automating the identification process for a target region to be subjected to hardware extension or extended instruction use, a user may designate a target region via the input/display unit 114.

If the determination process in step S204 determines that both the constraints 110 and the target performance have been satisfied, this procedure proceeds to the semiconductor fabrication steps beginning with step S211.

In step S211, mask data for a semiconductor circuit including a designed processor is generated using the results of designing in steps S201 to S205. In step S212, masks are made based on the mask data generated in step S211. In step S213, a semiconductor circuit pattern including the above-mentioned processor is formed in and on a semiconductor substrate using the masks made in step S211.

Figure 4:
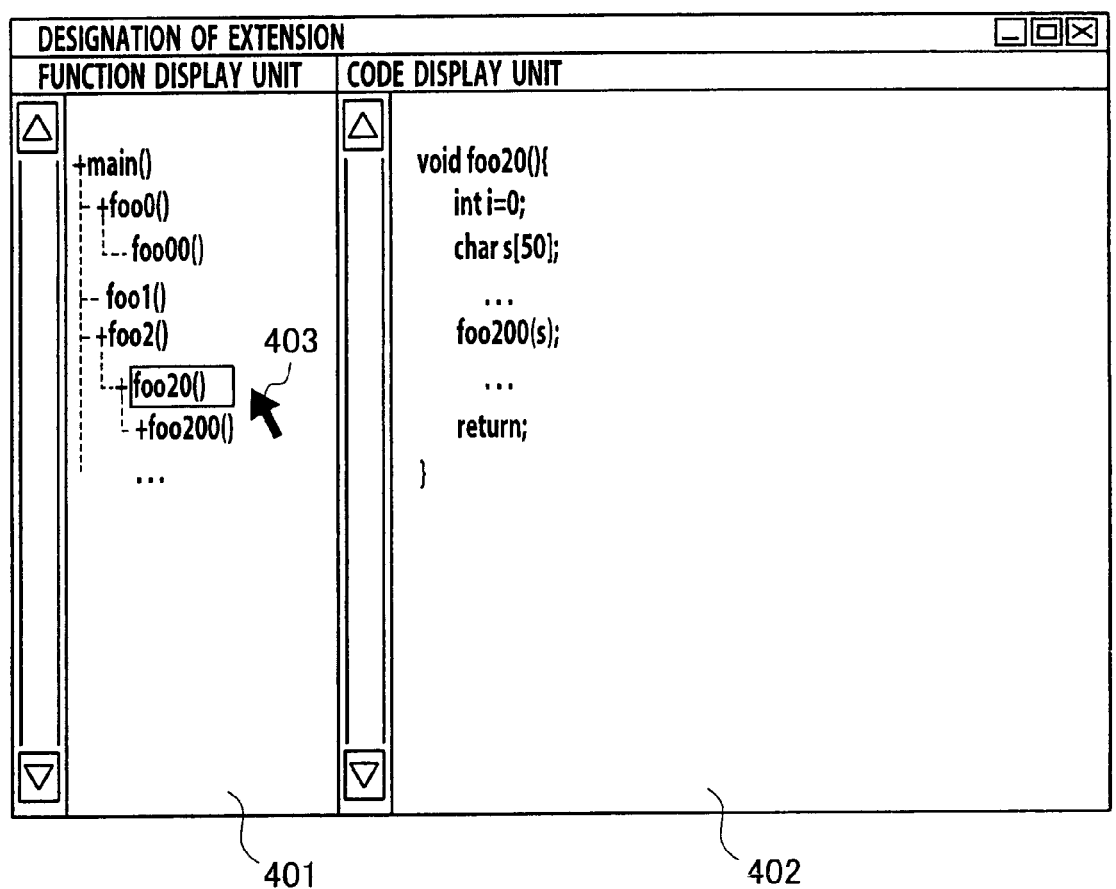
FIG. 4 shows an exemplary layout of a display screen used to designate a target portion to be subjected to hardware extension and/or extended instruction use.

FIG. 4 shows an exemplary display screen used for designating a target region to be subjected to hardware extension or extended instruction use via the input/display unit 114.

On the left side of the screen, a function display window 401 displaying functions comprising the program 101 is deployed such that calling relationships among functions can be understood. On the right side of the screen, a code display window 402 displaying function codes is deployed.

There are the following five types of operations for the function display window 401.

A first type of operation is to select a target function to be subjected to hardware extension. Multiple functions may be selected through this operation. According to the example shown in FIG. 4, a function 'foo200( )' is selected. The function selected through this first operation is a priority target to be subjected to hardware extension.

A second type of operation is to select a function not to be subjected to hardware extension. Multiple functions may be selected through this operation. The functions selected through this operation are not targets to be subjected to hardware extension.

A third type of operation is to select a target function to be subjected to extended instruction use. Multiple functions may be selected through this operation. The function selected through this operation is a priority target to be subjected to extended instruction use.

A fourth type of operation is to select a function not to be subjected to extended instruction use. Multiple functions may be selected through this operation. The functions selected through this operation are not targets to be subjected to extended instruction use.

A fifth type of operation is to select a function in which codes are to be displayed in the code display window 402. According to the example shown in FIG. 4, codes in the function 'foo200( )' selected in the function display window are displayed.

There are two types of operations for the code display window 402.

A first type of operation is to designate a target code region to be subjected to extended instruction use. Multiple regions may be designated through this operation. The region designated through this operation is a priority target to be subjected to extended instruction use.

A second type of operation is to designate a code region not to be subjected to extended instruction use. Multiple regions may be designated through this operation. The regions designated through this operation are not subjected to extended instruction use.

Figure 5:
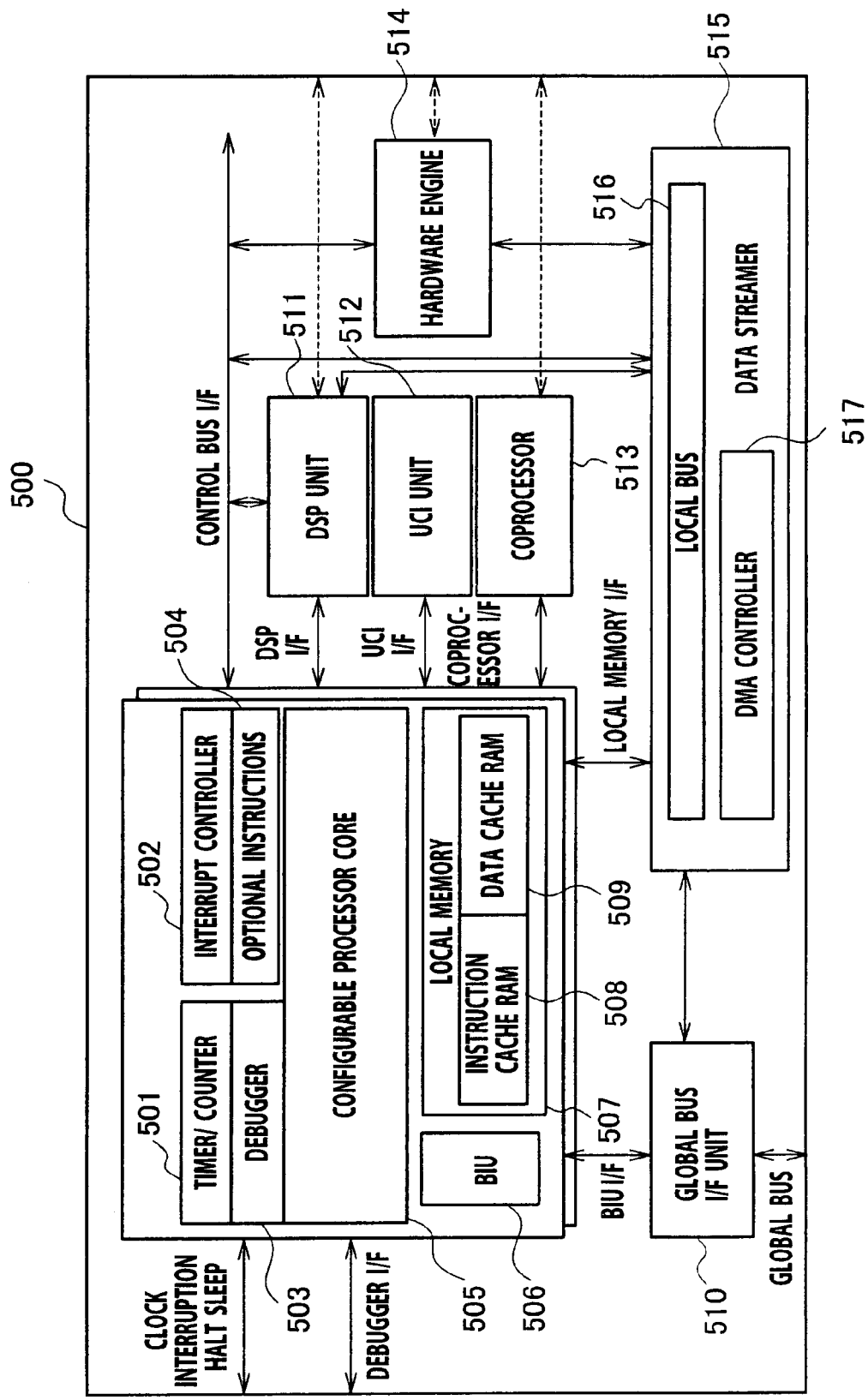
FIG. 5 exemplifies a configuration of a configurable processor designed using the design apparatus and the design method according to the first embodiment.

FIG. 5 shows an exemplary configuration of a configurable processor 500 designed using a design apparatus and a design method according to this embodiment. The configurable processor 500 includes a timer/counter 501, an interrupt controller 502, a debugger 503, optional instructions 504, a configurable processor core 505, a bus interface unit (BIU) 506, local memory including instruction cache RAM 508 and data cache RAM 509, a global bus interface unit 510, a DSP unit 511, a user customized instruction (UCI) unit 512, a coprocessor 513, a hardware engine 514, and a data streamer 515 including a local bus 516 and a DMA controller 517. With the design apparatus and the design method according to the first embodiment, the optional instructions 504, the DSP unit 511, the UCI unit 512, the coprocessor core 505, the hardware engine 514 or related units become targets for extension, and the configurable processor 500 is extended to execute at an enhanced speed while compensating the performance of the configurable processor core 505.

As is described above, since the design apparatus and the design method of the first embodiment allow automatic definition of extended instructions, automatic extension of hardware, and automatic selection of an extended instruction, evaluation of a variety of extension methods can be made within a short time, which allows selection of an optimal extension method.

Second Embodiment

This second embodiment section describes how the extending unit 109 in the design apparatus shown in FIG. 1, more specifically, the extended instruction definition unit 141 determines whether or not extended instruction use target blocks in the program 101 can be surely subjected to extended instruction use, and if yes, how it generates a sequence of multiple instructions that define an equivalent extended instruction.

In addition to a predetermined instruction set, the configurable processor allows users to define application-specific extended instructions. Replacement of a bottleneck region in the program 101 with a smaller number of extended instructions particularly allows improvement in performance and code size. Therefore, that replacement is very effective. However, since in reality, there are constraints such as a limited number of registers capable of being used for operands and a limited number of arithmetic logic units, replacing a part of a program as is with an extended instruction is seldom. Therefore, users have to change the configuration of the program by trial and error, and find an extended instruction possible for replacement. This is time-consuming work for the users.

Figure 6:
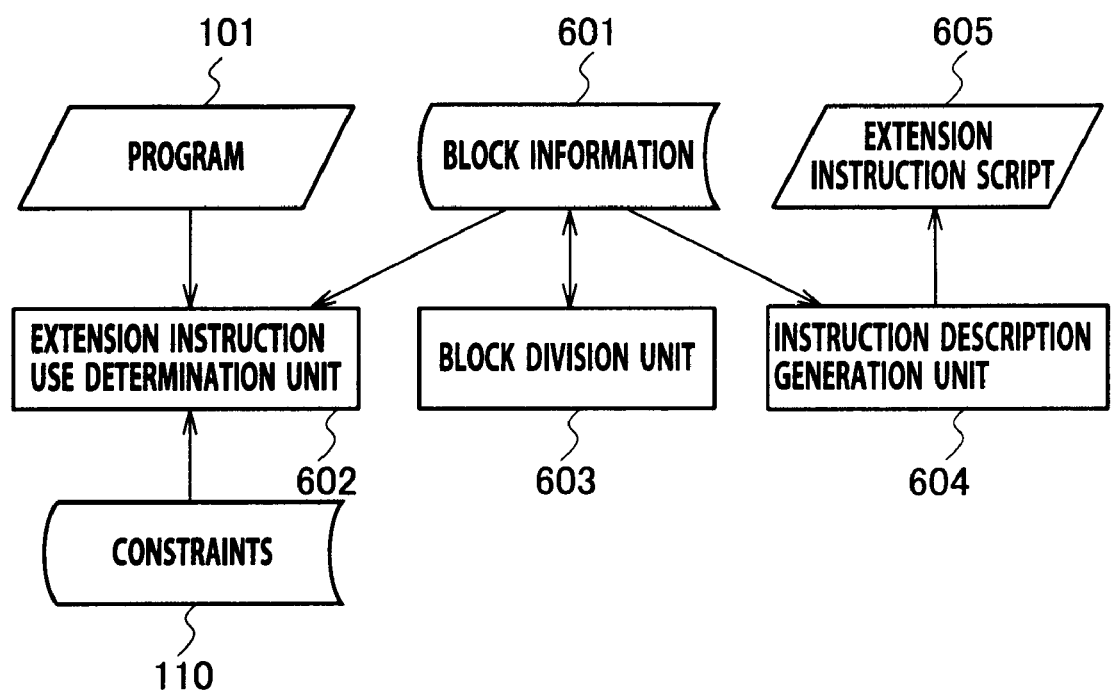
FIG. 6 shows an exemplary configuration of an extended instruction definition unit according to the second embodiment.

To solve this problem, as shown in FIG. 6, the extended instruction definition unit 141 according to the second embodiment includes an extended instruction use determination unit 602, which determines whether or not it is possible to generate an extended instruction for a process equivalent to a process for a extended instruction use target block in the program 101 (wherein that target block is designated based on block information 601), and an instruction script generation unit 604, which generates an extended instruction script 605 for a process equivalent to a process for the target block in response to the determination results by the extended instruction use determination unit 602. The extended instruction definition unit 141 includes a block division unit 603, which divides that target block. The instruction script generation unit 604 generates the extended instruction script 605 for part or all of each sub-block divided by the block division unit 603.

Note that the block division unit 603 is also capable of dividing a single statement in the program 101 into multiple blocks. The instruction script generation unit 604 is also capable of generating the extended instruction script 605 for a statement employing a predetermined variable or a block of the blocks generated by being divided that includes an instruction sequence employing a predetermined register. Moreover, the instruction script generation unit 604 is also capable of generating the extended instruction script 605, which defines a transfer instruction for transferring between a processor and an external register of the processor to which a variable used in a block is assigned.

Figure 7:
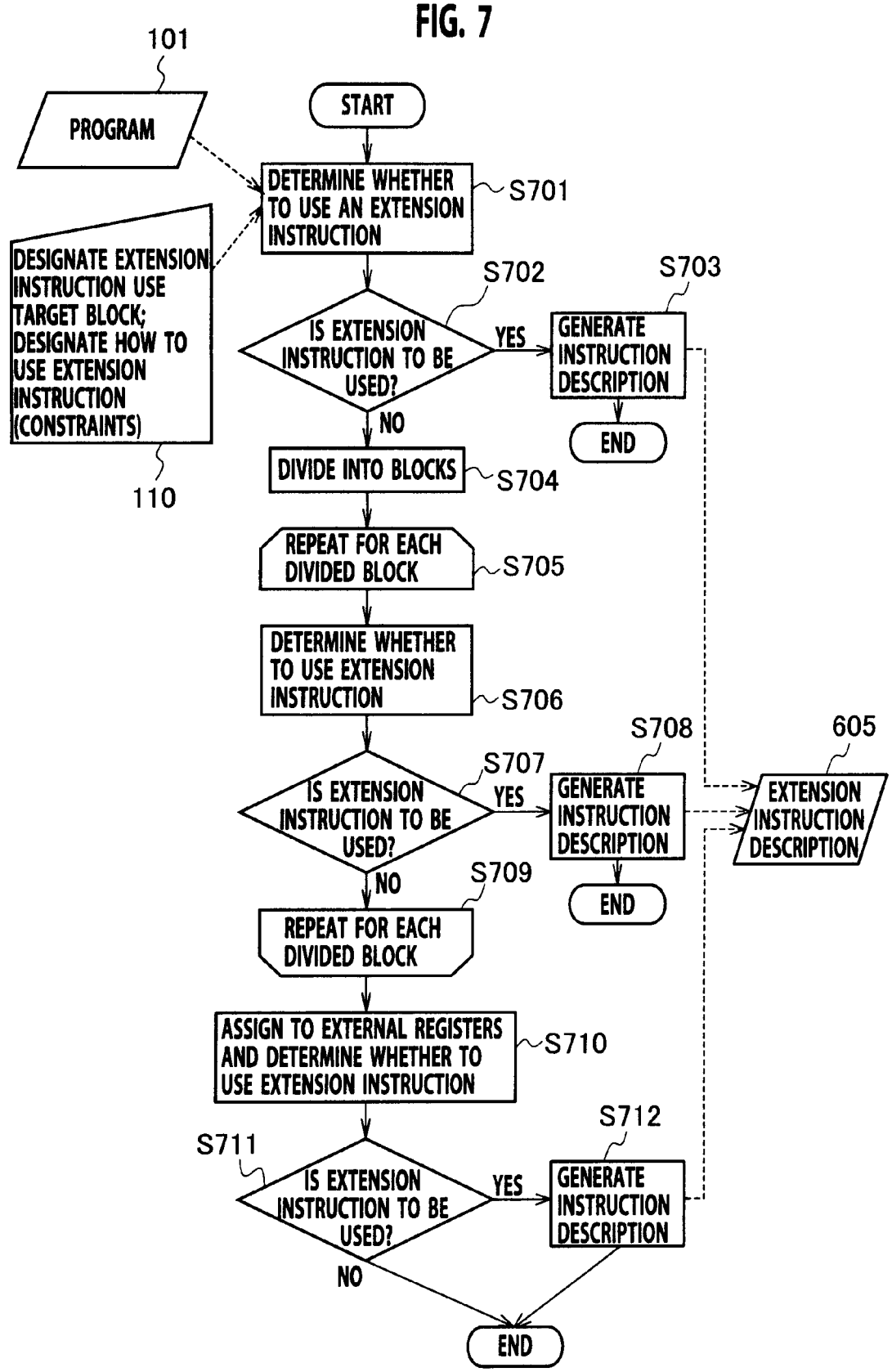
FIG. 7 is a flowchart showing an exemplary operation of generating an extended instruction script by the extended instruction definition unit shown in FIG. 6.

FIG. 7 shows an exemplary process of generating the extended instruction script 605 carried out by the extended instruction definition unit 141.

Note that the following example represents a case of a block of statements from lines 0811 to 0814 in a program shown in FIG. 8 being designated as a target block and also coprocessor extension being selected and designated from several types of prepared instruction extension methods (these instruction extension methods are designated in the constraints 100). Criteria for determining whether extended instruction use is possible depend on the selected instruction extension method. Criteria for determining whether extended instruction use for coprocessor extension is possible are described in a section describing an extended instruction use determination process. It is assumed here that the coprocessor 513 having instructions given as an example in FIG. 9 is already attached.

'_cop' in line 0803 of FIG. 8 is a designator, which designates the compiler 121 to assign declared variables attached with that designator to registers of the coprocessor 513. FIG. 10 shows assembly codes resulting from compiling the source program of FIG. 8.

In step S701, the extended instruction use determination unit 602 determines whether or not an extended instruction for an extended instruction use target block can be generated. If the determination results (in step S702) reveal that generation of an extended instruction is possible, in step S703, the instruction script generation unit 604 generates the extended instruction script 605 for carrying out a process equivalent to a process for an extended instruction use target block.

It is assumed here that the constraints 110 for coprocessor extension include a limited number of definable operands in each extended instruction being three at the maximum, and a limited number of definable operands for general purpose registers of the processor core 505 being two at the maximum. Since the target block needs at least four registers of the core for operands, the extended instruction use determination unit 602 determines that it is impossible to use an extended instruction for that block.

Next, in step S704, the block division unit 603 divides the present block and tries to use an extended instruction. The block division unit 603 divides such that each statement in the block of lines 0811 to 0814 can comprise a block, and then tries to use an extended instruction for each divided block through a looping process from step S705 to step S709.

Since each of statements 0811 to 0813 in FIG. 8 are converted to a single instruction as shown in lines 1001 to 1003, the extended instruction use determination unit 602 determines in step S706 that each of them do not need to use an extended instruction. On the other hand, since the statement in line 0814 of FIG. 8 is converted to three consecutive instructions in lines 1004 to 1006 of FIG. 10, the extended instruction use determination unit 602 determines whether or not the constraints 110 for coprocessor extension are satisfied. A command statement in line 0814 of FIG. 8 inputs two values in respective registers of the processor core 505, the value in the register of the coprocessor 513, and a constant value, and then returns the corresponding result to the register of the processor core 505. Embedding the constant value somewhere within the operation for the instruction in place of an immediate addressing operand allows definition of that instruction having two processor core 505 register operands and a single coprocessor 513 register operand, thereby satisfying the constraints 110 for coprocessor extension. Therefore, the extended instruction use determination unit 602 determines that the command statement in line 0814 can use an extended instruction.

In step S708, as exemplified in FIG. 11, the instruction script generation unit 604 generates an extended instruction definition script 605 for the command statement in line 0814. The name of the extended instruction is 'cinst_' plus a number at the end for the extended instruction (e.g., '0001' in the case of the example in FIG. 11), avoiding conflict with already defined instructions. Arguments in line 1101 are for variables that appear in line 0814 of FIG. 8. The behavior definition field in line 1103 is filled with the statement itself in line 0814 of FIG. 8. Note that instruction names and opcodes may be designated via the input/display unit 114.

Usage of 'An Optimization Method Used by Compiler' described later and giving an instruction script definition shown in FIG. 11 to the compiler (e.g., compiler 121) allows customization of the compiler to allow generation of coprocessor instructions defined in FIG. 8. The statement in line 0814 of FIG. 8 is compiled by the compiler after addition of extended instructions, into the compilation results shown in line 1204 of FIG. 12. The codes shown in FIG. 12 reduce by two instructions as compared with the number of codes in FIG. 10, which means that it is effective to decrease the code size, the number of executable instructions, and the number of execution cycles. Moreover, it is expected that application of such operation to many places of a source program may provide further improved results. Furthermore, conventionally, such an instruction addition procedure has been manually conducted; however, since it is automatically conducted using this system according to the present invention, development periods can be significantly reduced. Note that dividing blocks is conducted for every statement with those examples explained here; however, the unit of division may be every group of multiple statements or every partial section of a statement, and is defined through syntax tree analysis. Furthermore, this invention is explained by exemplifying the C language program; however, other computer languages such as an assembly language or a binary script may be used as well. When processing an assembly language program or a binary language program, the block division process should divide an instruction sequence. The behavior section in an instruction script written in an assembly language or a binary language should be generated as a script written in C or another language equivalent to an instruction sequence using an extended instruction.

Furthermore, according to the aforementioned description, the extended instruction use determination unit 602 has an existence of an instruction with an equivalent number of operands as a condition for determining whether extended instruction use is possible; however, the condition may further include a type of operation, types of statements appearing in a block or the like. For example, an instruction extension method capable of defining only instructions, each spending a single machine cycle while being executed, may determine that a multiplication instruction in a block cannot be processed. In addition, if a memory access statement or a control statement such as a function call statement exists in a block, the block cannot be processed either.

The flowchart of FIG. 7 shows the case of only a single extended instruction use target block being designated; alternatively, multiple extended instruction use target blocks may be subjected to repetitive execution of the process in FIG. 7, generating the extended instruction script 605 for those multiple target blocks. Moreover, according to the flowchart of FIG. 7, if any divided block is not available for extended instruction use, the procedure proceeds to the next step S710; alternatively, if it is determined that extended instruction use is impossible even by preparing several divided patterns, the procedure may still proceed to the next step S710. Furthermore, to control excessive increase in additional instructions, whether or not to carry out extended instruction use may be designated by a user via the input/display unit 114.

Next, the case of assigning variables to external registers of the processor is explained.

It is assumed here that a statement in line 1306 of FIG. 13 is provided as an extended instruction use target block. Note that the assembly codes, which result from compiling the program shown in FIG. 13 using an instruction set without extended instructions, are shown in FIG. 14. The assembly codes corresponding to the statement in line 1306 of FIG. 13 are shown in lines 1404 to 1405.

As shown in the flowchart of FIG. 7, in step S701, the extended instruction use determination unit 602 determines whether the statement in line 1306 of FIG. 13 can be subjected to extended instruction use. When the condition of limiting extended instructions is that up to two operands can be used for general purpose registers of the processor core 505, the statement in line 1306 takes three registers corresponding to variables 'tmp', 'a[i]', and 'x[i]'. Therefore, the extended instruction use determination unit 602 determines in step S702 that extended instruction use is impossible.

Next, in step S703, the block division unit 603 tries to resolve the statement in line 1306. The block division unit 603 conducts syntax tree analysis for the statement in line 1306, resolving it into two blocks: 'Z=(a[i]+x[i])/2' and 'tmp=tmp+Z'. Note that the variable 'Z' is an intermediate variable developed by resolving the statement.

In step S706, the extended instruction use determination unit 602 determines whether or not those two blocks can be subjected to extended instruction use. Since it is not determined whether the intermediate variable 'Z' can share a register assigned for either 'a[i]' or 'x[i]' in the block of 'Z=(a[i]+x[i])/2', three register operands are needed. Therefore, the extended instruction use determination unit 602 determines that the block of 'Z=(a[i]+x[i])/2' cannot be subjected to extended instruction use. On the other hand, since the block of 'tmp=tmp+Z' is converted to a single instruction, the extended instruction use determination unit 602 determines that that block cannot be subjected to extended instruction use. And even if the statement 'Z=(a[i]+x[i])/2' were to be further divided, it could only be divided into a block, which can be converted to a single instruction. Therefore, the procedure proceeds to extended instruction use determination step S710, which considers assignment of variables to external registers of the processor.

It is assumed here that data types of variables and other attributes thereof appearing in each statement shown in FIG. 13 are already known. Acquisition of this information can be made through a well-known program analysis technique, and the program analysis results may be provided externally, or a program analysis function may be included.

With this embodiment, variables suitable for being assigned to external registers are chosen from the variables in a block, and the variable 'tmp' is assumed to be assigned to an external register because it is a basic data type local variable. As a result, the number of the registers of the core for line 1306 is only two corresponding to variables 'a[i]' and 'x[i]'. Therefore, in step S711, the extended instruction use determination unit 602 determines that extended instruction use is possible.

In step S712, since the instruction script generation unit 604 assigns to an external register the variable as well as the instruction corresponding to the block in line 1306, an instruction for data transfer between the extended module registers and the processor general purpose registers is automatically, additionally generated. As a result, the instruction script generation unit 604 generates an instruction definition script 605, which defines three instructions as exemplified in FIG. 15. A variable 'dspreg' appearing in the behavior section of the instruction definition script 605 exemplified in FIG. 15 is a variable representing a register in the extended module, and is defined as 'reg: 32: dspreg;'. The instruction 'dspst' is a transfer command for transferring from the processor registers to the extended module registers, while the instruction 'dspld' is a transfer command for transferring from the extended module registers to the processor registers. 'dspreg' in place of the variable 'tmp' assigned to an external register is used in the behavior section of the instruction 'dinst_0001' generated from the statement in line 1306.

At this time, usage of 'An Optimization Method Used by Compiler' described later and provision of an instruction script definition to a compiler (compiler 121) allows customization of the compiler, providing the results of compiling the statement in line 1306 of FIG. 13 as shown in FIG. 16. Moreover, since the variable 'tmp' is assigned to a register in the extended module, the compiler generates in a place which substitutes for the variable 'tmp' and references the same, a transfer command for transferring to a register in the extended module. As a result, a transfer command for transferring from/to registers in the extended module is inserted before and after a loop; however, since the number of instructions in the loop decreases, both the number of executed instructions and the number of execution cycles decrease, and thus performance enhances.

(An Optimization Method Used by Compiler)

The aforementioned 'An Optimization Method Used by Compiler' is described forthwith.

When a user-defined extended instruction and definition of the behavior thereof are provided to the compiler (compiler 121), the compiler optimizes one of the instructions described in the program 101 for carrying out the same operation as that of an extended instruction defined by a user, into a machine language script corresponding to the user-defined extended instruction. More specifically, when carrying out a syntax analysis for the program 101, the compiler analyzes whether the instructions in the program 101 complies with the grammatical rules for instructions in the program 101, also analyzes whether a combination of instructions defines the extended instructions and the behaviors thereof, and then stores the definitions for the syntax-analyzed extended instructions and the behaviors thereof. Afterwards, the compiler determines whether or not the machine language scripts generated from a source program correspond to the behaviors of the stored, extended instructions; if yes, the compiler optimizes the machine language scripts into optimized machine language scripts corresponding to the behaviors of the extended instructions.

In this manner, the compiler 121 is capable of optimizing the compilation process for the program 101 using extended instructions defined by a user.

As has been detailed thus far, the second embodiment allows effective and easy definition of additional instructions, which used to be time-consuming and troublesome. Moreover, since the compiler is capable of automatically handling those additional instructions, the code size can be reduced and performance can be improved promptly.

Moreover, since the compiler is capable of block division, register assignment and the like, generation of various patterns of intra-block additional instructions can be made, and effectively searching for an extended instruction that has been conventionally searched by trial and error by a user is possible.

Third Embodiment

When dynamically analyzing the behavior of the program 101 based upon the simulation results, more specifically, analyzing each function execution count, for example, the dynamic analysis unit 132 can merely analyze the behavior roughly and cannot determine whether or not a certain sequence of consecutive instructions operate properly under a certain operating condition. In addition, analysis of each instruction execution count brings about losing the before and after relationship of each instruction, thereby making it impossible to judge with perspective. Therefore, with the third embodiment, an example of the behavior of the dynamic analysis unit 132 dividing an instruction sequence into basic blocks, which do not include branch instructions and do not converge, and then analyzing each basic block execution count is described.

Figure 17:
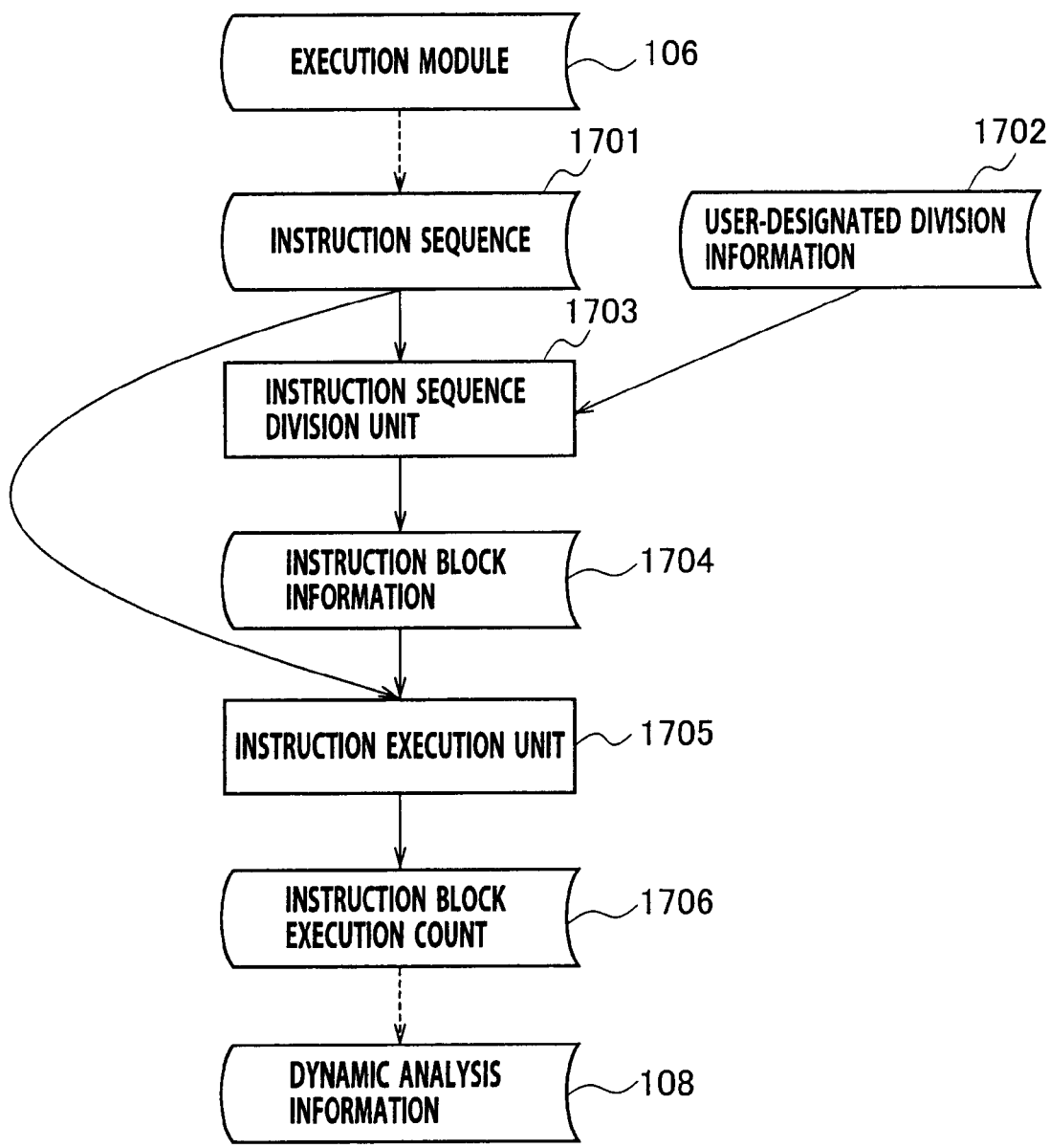
FIG. 17 shows an exemplary configuration of a dynamic analysis unit according to the third embodiment.

FIG. 17 shows an exemplary configuration of the dynamic analysis unit 132 according to the third embodiment. An instruction sequence division unit 1703 receives an instruction sequence 1701 in an execution module 106 generated by the compiler 121 (compiler or assembler) and user designation division information 1702, which is information of an instruction block that a user desires to analyze the behavior (e.g., obtain an execution count), divides the instruction sequence 1701 within the range of the user designation division information 1702 into a block, and then outputs instruction block information 1704. The instruction sequence 1701 is generally called 'object codes' or 'execution codes'. The user designation division information 1702 is information of a range of the instruction sequence 1701 to be subjected to behavior analysis that a user has designated, and is made up of a code start address and an end address. Note that the user designation division information 1702 is unessential that the instruction sequence division unit 1703 executes block division within a predetermined range as long as the user designation division information 1702 is not designated.

An instruction execution unit 1705 analyzes each instruction block execution count using the instruction block information 1704 output by the instruction sequence division unit 1703, and then outputs the analysis results as an instruction block execution count 1706, which will be dynamic analysis information 108.

Figure 18:
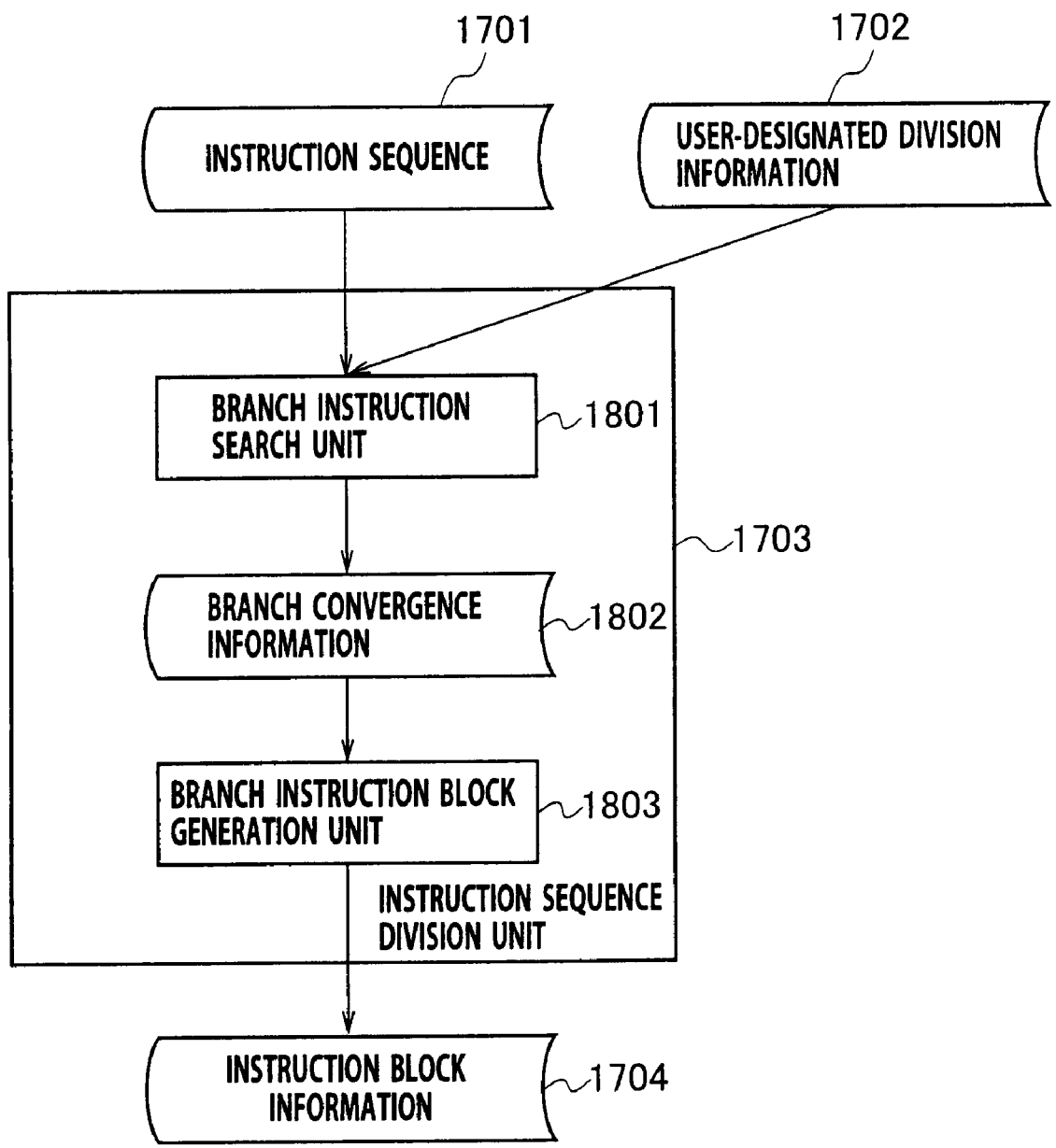
FIG. 18 shows an exemplary configuration of an instruction sequence division unit in the dynamic analysis unit shown in FIG. 17.

FIG. 18 exemplifies a detailed structure of the instruction sequence division unit 1703. A branch instruction searching unit 1801 inputs the user designation division information 1702, and then defines the division range designated by a user as a search range. The branch instruction searching unit 1801 stores the start address for the instruction sequence 1701 as an initial value of a destination branch address for branch convergence information 1802.

Afterwards, the branch instruction searching unit 1801 searches the instruction sequence within the search range for all instructions possibly developing branches, and then stores as the branch convergence information 1802, an address for the searched branch instruction and a destination branch address, and information of whether the address is either for the branch instruction or for the branch destination. Since there are more than two destination branch addresses for conditional branch instructions, the branch instruction searching unit 1801 stores all of those addresses in the branch convergence information 1802.

Next, a branch block generation unit 1803 outputs the user designation division information 1702 as instruction block information 1704, sorts the branch convergence information 1802 according to address order, and then adds to the instruction block information 1704 the combination of before and after the sorted branch convergence information 1802 as an instruction block. Note that if the end address is a destination branch address when converting the branch convergence information 1802 to the instruction block information 1704, the value of the address is decreased by one. At this time, if the start address is a branch address, an instruction block is not added to the branch convergence information 1802.

Figure 19:
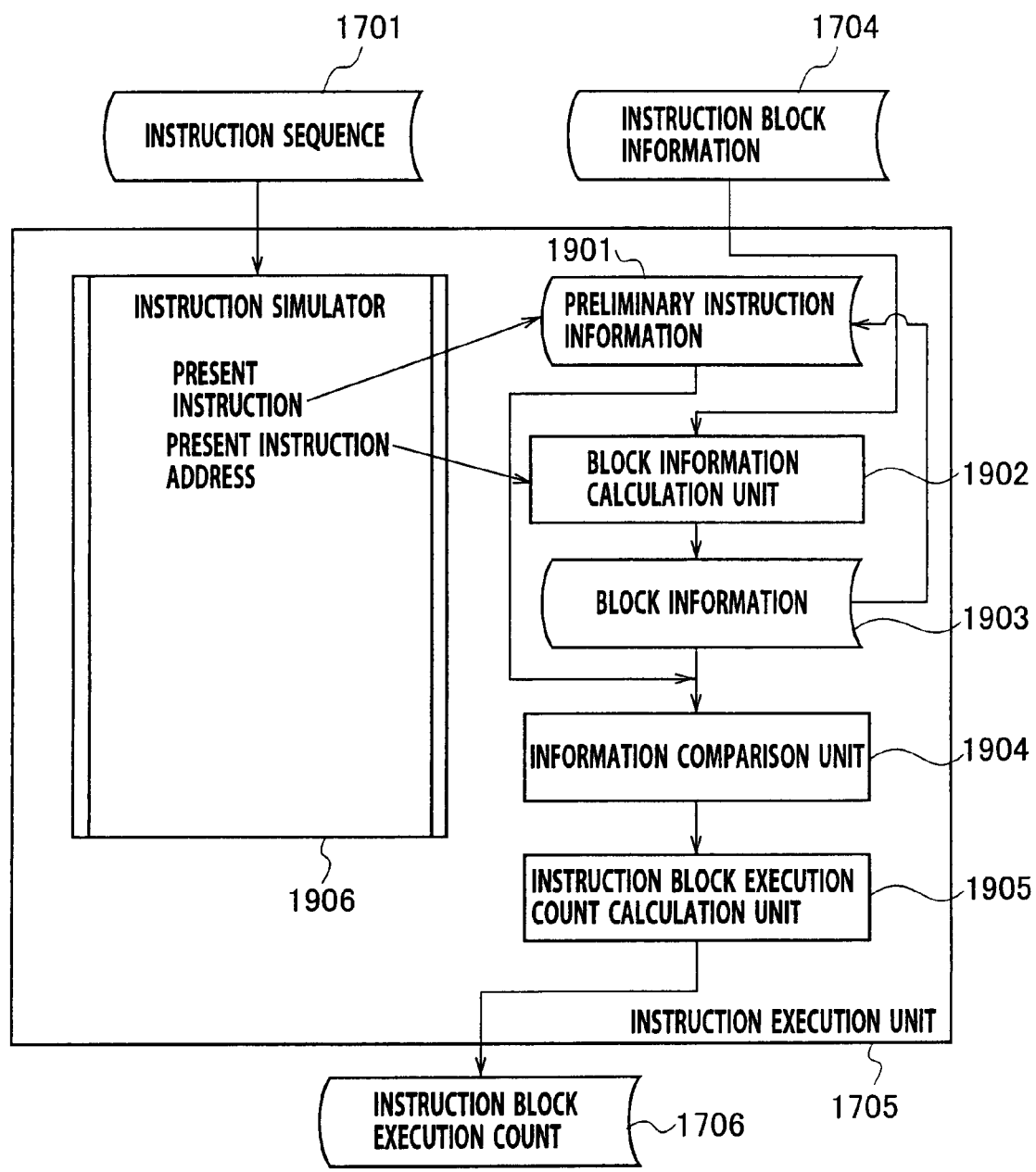
FIG. 19 shows an exemplary configuration of an instruction execution unit in the dynamic analysis unit shown in FIG. 17.

FIG. 19 exemplifies a detailed configuration of the instruction execution unit 1705. An instruction block execution count is calculated using a present instruction and a present address kept by an instruction simulator 1906. Every time the instruction simulator 1906 executes a single instruction, the following operation is carried out. Firstly, the instruction execution unit 1705 makes preliminary instruction information 1901 be nil before starting simulation. At the time of simulation, a block information calculation unit 1902 calculates and finds an instruction block to which the present instruction belongs, using the present address and the instruction block information 1704, and then stores the calculation results as block information 1903.

Afterwards, an information comparison unit 1904 inputs the preliminary instruction information 1901 and the block information 1903, and then determines whether or not to calculate the instruction block execution count 1706. If the output of the information comparison unit 1904 is different from that for the instruction block having the preliminary instruction information 1901 as the block information 1903, or if the instruction in the preliminary instruction information 1901 is a branch instruction, logical true is returned; otherwise, if not, logical false is returned.

An instruction block execution count calculation unit 1905 increments by one the execution count for a block corresponding to the block information 1903 only if the output of the information comparison unit 1904 is logical true. Lastly, the instruction block execution count calculation unit 1905 registers the present instruction and the block information 1903 as the preliminary instruction information 1901 irrelevant to the output value of the information comparison unit 1904.

The operation of the dynamic analysis unit 132 according to the third embodiment is explained forthwith using a specific example. Note that the user designation division information 1702 is not designated in the example described below.

FIG. 20 shows an example of the instruction sequence 1701 that the dynamic analysis unit 132 receives. The instruction sequence 1701 is made up of a combination of address information and an instruction. In reality, the instruction sequence 1701 is binary notation codes; however, for simplicity of explanation, the instructions are represented by mnemonic codes. According to the third embodiment, an instruction sequence 1701 including five types of instructions: 'LD', 'ADD', 'SUB', 'JNZ', and 'JMP' is prepared. Variables starting with 'R' in mnemonic notation denote registers, while numeric values surrounded with '( )' denote memory access. The instruction 'LD' denotes load and store; 'ADD' denotes addition; 'SUB' denotes subtraction; 'JNZ' denotes branch if not zero; and 'JMP' denotes unconditional jump.

Firstly, when the instruction sequence division unit 1703 has inputted the instruction sequence 1701 shown in FIG. 20, the branch instruction searching unit 1801 stores the start address '0001' for the instruction sequence 1701 with an attribute of 'branch destination' in the branch convergence information 1802. The branch instruction searching unit 1801 then searches the instruction sequence 1701 for a branch instruction. In the instruction sequence 1701, a branch instruction exists in addresses: '0006', '0009', and '000d'; wherein the branch instruction in the address '0006' is a conditional branch instruction, and if the condition is satisfied, branching to an address of '000a' is carried out. Otherwise, if not, the instruction in an address '0007' is executed. The branch instruction searching unit 1801 registers the address '0006' with an attribute of 'branch' and the addresses '000a' and '0007' with an attribute of 'branch destination' in the branch convergence information 1802. Repetition of the same operations described above provides the branch convergence information 1802 as shown in FIG. 21. Lastly, the branch instruction searching unit 1801 sorts the branch convergence information 1802 according to address order, generating sorted branch convergence information 1802 as shown in FIG. 22.

Afterwards, a branch block generation unit 1803 inputs the branch convergence information 1802 generated as shown in FIG. 22, and then generates instruction block information 1704. The branch block generation unit 1803 reads out two consecutive pieces of information starting at the top address of the branch convergence information 1802. Pieces of information from addresses '0001' (branch destination) and '0002' (branch destination), which are a start address and an end address for the block information 1704, respectively, are read out first. In the case of using information with an attribute of 'branch destination' for the end address, that address is decreased by one. As a result, pieces of information such as a start address of '0001' and an end address of '0001' are obtained. The branch block generation unit 1803 registers those pieces of information in the instruction block information 1704.

Since information read out next from the branch convergence information 1802 is a combination of the addresses '0002' (branch destination) and '0006' (branch), the branch block generation unit 1803 registers information such as a start address of '0002' and an end address of '0006' in the instruction block information 1704.

Information read out next from the branch convergence information 1802 is a combination of the addresses '0006' (branch) and '0007' (branch destination); however, since an address with an attribute of 'branch' is not used as a start address, no operation is carried out with this combination.

Information read out next from the branch convergence information 1802 is a combination of the addresses '0007' (branch destination) and '0009' (branch). Proceeding as such results in provision of the instruction block information 1704 as shown in FIG. 23. Note that the instruction block information 1704 has an instruction block number attached to each block for identification.

Lastly, the instruction execution unit 1705 carries out simulation for instructions, and then calculates the instruction block execution count 1706. The first ten instructions are detailed below. It is assumed that the condition for the conditional branch instruction in the address '0006' is satisfied and jumps to an address '000a'.

(1) Regarding address '0001': the block information calculation unit 1902 calculates and finds that the instruction in the address '0001' belongs to a block with an instruction block number '0'. The determination results of the information comparison unit 1904 say 'no match' because the preliminary instruction information 1901 is nil. The instruction block execution count calculation unit 1905 adds one to the execution count for the instruction block number '0', and then registers the present instruction 'LD' and the instruction block number '0' in the preliminary instruction information 1901.

(2) Regarding address '0002': the block information calculation unit 1902 calculates and finds that the instruction in the address '0002' belongs to a block with an instruction block number '1'. The determination results of the information comparison unit 1904 say 'no match' because the contents of the preliminary instruction information 1901 are an instruction 'LD' and an instruction block number '0'. The instruction block execution count calculation unit 1905 adds one to the execution count for the instruction block number '1', and then registers the present instruction 'LD' and the instruction block number '1' in the preliminary instruction information 1901.

(3) Regarding address '0003': the block information calculation unit 1902 calculates and finds that the instruction in the address '0003' belongs to a block with an instruction block number '1'. The determination results of the information comparison unit 1904 say 'match' because the contents of the preliminary instruction information 1901 are an instruction 'LD' and an instruction block number '1'. The instruction block execution count calculation unit 1905 does not calculate the execution count, but registers the present instruction 'LD' and the instruction block number '1' in the preliminary instruction information 1901.

(4) Regarding address '0004': the block information calculation unit 1902 calculates and finds that the instruction in the address '0004' belongs to a block with an instruction block number '1'. The determination results of the information comparison unit 1904 say 'match' because the contents of the preliminary instruction information 1901 are an instruction 'LD' and an instruction block number '1'. The instruction block execution count calculation unit 1905 does not calculate the execution count, but registers the present instruction 'ADD' and the instruction block number '1' in the preliminary instruction information 1901.

(5) Regarding address '0005': the block information calculation unit 1902 calculates and finds that the instruction in the address '0005' belongs to a block with an instruction block number '1'. The determination results of the information comparison unit 1904 say 'match' because the contents of the preliminary instruction information 1901 are an instruction 'ADD' and an instruction block number '1'. The instruction block execution count calculation unit 1905 does not calculate the execution count, but registers the present instruction 'LD' and the instruction block number '1' in the preliminary instruction information 1901.

(6) Regarding address '0006': the block information calculation unit 1902 calculates and finds that the instruction in the address '0006' belongs to a block with an instruction block number '1'. The determination results of the information comparison unit 1904 say 'match' because the contents of the preliminary instruction information 1901 are an instruction 'LD' and an instruction block number '1'. The instruction block execution count calculation unit 1905 does not calculate the execution count, but registers the present instruction 'JNZ' and the instruction block number '1' in the preliminary instruction information 1901.

(7) Regarding address '000a': the block information calculation unit 1902 calculates and finds that the instruction in an address '000a' belongs to a block with an instruction block number '3'. The determination results of the information comparison unit 1904 say 'no match' because the contents of the preliminary instruction information 1901 are an instruction 'JNZ' and an instruction block number '1'. The instruction block execution count calculation unit 1905 adds one to the execution count for the instruction block number '3', and then registers the present instruction 'SUB' and the instruction block number '3' in the preliminary instruction information 1901.

(8) Regarding address '000b': the block information calculation unit 1902 calculates and finds that the instruction in an address '000b' belongs to a block with an instruction block number '4'. The determination results of the information comparison unit 1904 say 'no match' because the contents of the preliminary instruction information 1901 are an instruction 'SUB' and an instruction block number '3'. The instruction block execution count calculation unit 1905 adds one to the execution count for the instruction block number '4', and then registers the present instruction 'LD' and the instruction block number '4' in the preliminary instruction information 1901.

(9) Regarding address '000c': the block information calculation unit 1902 calculates and finds that the instruction in an address '000c' belongs to a block with an instruction block number '4'. The determination results of the information comparison unit 1904 say 'match' because the contents of the preliminary instruction information 1901 are an instruction 'LD' and an instruction block number '4'. The instruction block execution count calculation unit 1905 does not calculate the execution count, but registers the present instruction 'SUB' and the instruction block number '4' in the preliminary instruction information 1901.

(10) Regarding address '000d': the block information calculation unit 1902 calculates and finds that the instruction in an address '000d' belongs to a block with an instruction block number '4'. The determination results of the information comparison unit 1904 say 'match' because the contents of the preliminary instruction information 1901 are an instruction 'SUB' and an instruction block number '4'. The instruction block execution count calculation unit 1905 does not calculate the execution count, but registers the present instruction 'JNZ' and the instruction block number '4' in the preliminary instruction information 1901.

Repetition of the same procedure described above brings about provision of an instruction block execution count 1706 as shown in FIG. 24. Note that the example shown in FIG. 24 results under such premises that the condition for the conditional branch instruction in the address '0006' is satisfied.

As described above, the third embodiment allows analysis of the execution count for each designated block and execution count for each instruction sequence that does not cause a branch operation to occur and does not cause convergence of the operation of that line; however, conventionally, analysis of the execution count or the like for each function and each instruction has been possible only during dynamic analysis for programs.

Frequency analysis for an executed instruction sequence conventionally has needed to search and determine all executed instruction sequences, and in the case where interruption or the like occurs, an instruction sequence for an interrupt process has been included in the same to-be-analyzed data. However, by generating to-be-analyzed data as shown in the third embodiment, searching an executable program, and counting the execution count for a target block, the same analysis results as in the case of searching all executable instruction sequences can be easily provided. As a result, the executable program size generally becomes much smaller than all executable instruction sequences, and drastic reduction in searching time is possible. Especially, this also allows effective reduction in the waiting time for an interactive process.

Fourth Embodiment

In a fourth embodiment, a case of a configurable processor design apparatus generating as an instruction set, user-defined instructions (extended instructions) that comply with user-given constraints 110 for running the program 101 is explained using a first and a second example forthwith. Moreover, an instruction subset to be used by changing part of an instruction set during execution and a corresponding processor are explained with the following third example.

First Example

Figure 25:
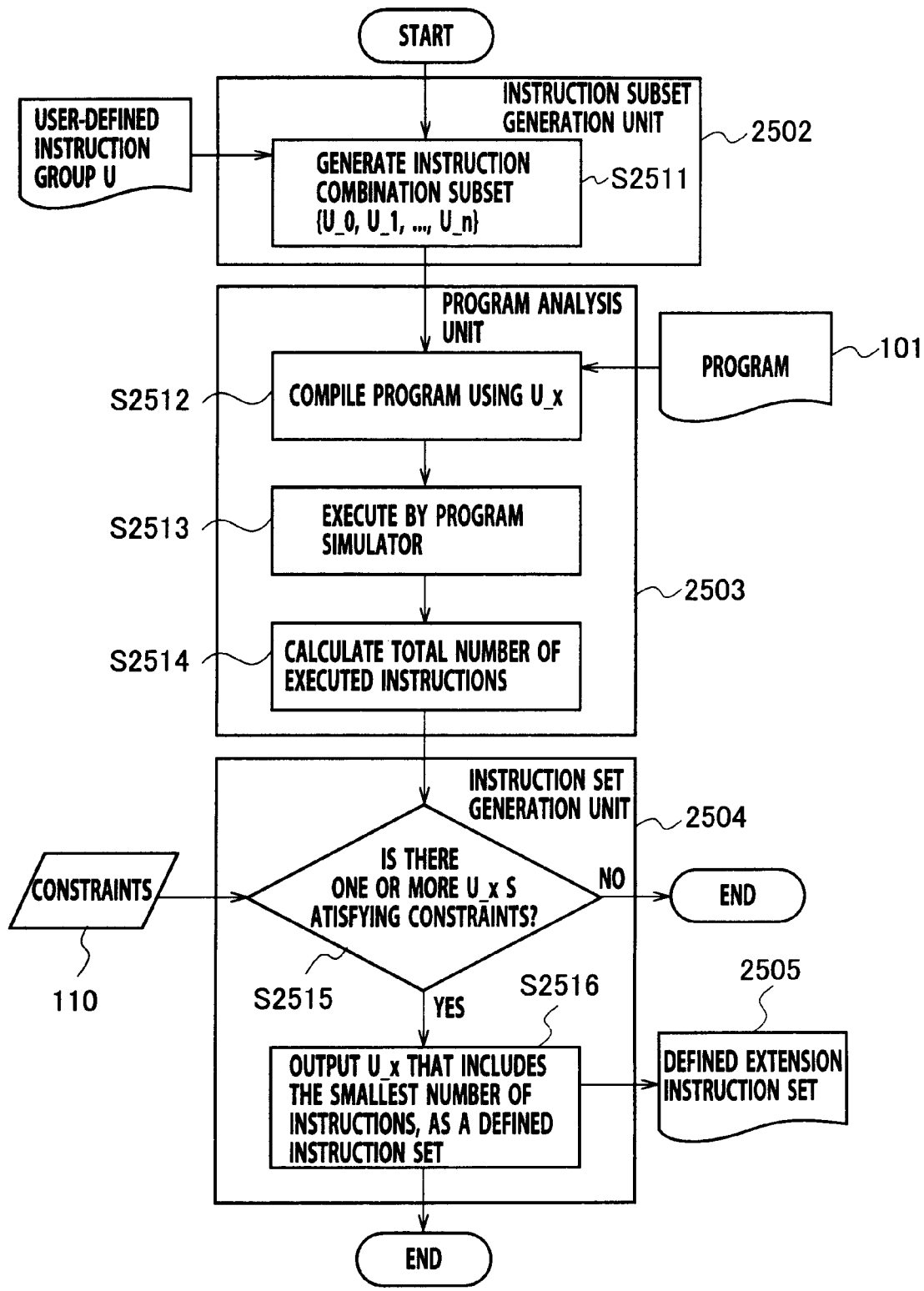
FIG. 25 shows an exemplary configuration of a design apparatus according to the fourth embodiment (first example)

FIG. 25 shows an exemplary configuration of a design apparatus according to the fourth embodiment (the first example). This design apparatus includes an instruction subset generation unit 2502, a program analysis unit 2503, an instruction set generation unit 2504, and/or related units. The instruction subset generation unit 2502 generates an instruction subset group (U_0, U_1, . . . , U_n) by making combinations of user-defined instructions (extended instructions) for the program 101 to be executed by the processor. The program analysis unit 2503 analyzes the effect of using each instruction subset based on syntax analysis information taken from the results of compiling the program 101 using each instruction subset, and profile information taken from the results of executing the program 101 using the compilation results. The instruction set generation unit 2504 selects an optimal instruction subset complying with the constraints 110 based on the analysis results provided by the program analysis unit 2503, and also selects the selected instruction subset as an extended instruction set definition 2505.

Firstly, a user provides to the design apparatus user-defined instruction group U and the program 101 to be executed by a processor.

In step S2502, the instruction subset generation unit 2502 combines instructions in the user-defined instruction group U provided as inputs, generating instruction subsets U_x (x=0, 1, . . . , n). Set U_all=(U_0, U_1, . . . , U_n) denotes all combinations of generated instructions.

The program analysis unit 2503 compiles and analyzes the program in the following procedure by focusing on each instruction subset U_x (x=0, 1, . . . , n) of the set U_all.

In step S2512, the program analysis unit 2503 compiles the program 101 using the instruction subset U_x as a user-defined instruction set, generating assembly codes and object codes. At this time, the compiler generates optimized assembly codes with the smallest code size using the 'Optimization Method Used by Compiler' technique described in the second embodiment and using user-defined instructions.

In step S2513, the program analysis unit 2503 executes through simulation the object codes generated in step S2512, and records the execution count for each basic block based on the profile information (dynamic analysis). Moreover, the program analysis unit 2503 records the number of instructions for each basic block based on the compiled program assembly codes (static analysis).

In step S2514, the program analysis unit 2503 multiplies each basic block execution count recorded in step S2513 by the number of instructions included in each basic block, obtaining the number of the executed instructions included in each block. Using the same procedure, the number of the executed instructions included in each basic block is calculated, and the sum of each of those numbers is the number of the executed instructions included in the entire program.

In step S2515, the instruction set generation unit 2504 determines whether or not there is an instruction subset U_x that allows the number of the executed instructions calculated by the program analysis unit 2503 to satisfy the user-given constraints 110. If it is determined that there is an instruction subset U_x that satisfies the user-given constraints 110, the instruction set generation unit 2504 outputs the instruction subset U_x in which the number of the defined instructions is the smallest, as an extended instruction set definition 2505 in step S2516.

A more specific example is described next.

The program 101 written in C as shown in FIG. 26 is input to the design apparatus. This program is made up of three basic blocks. A user-defined instruction group U as shown in FIG. 27 is also input to the design apparatus.

The program analysis unit 2503 compiles the program 101 inputted in FIG. 26, into assembly codes as the compilation results.

FIG. 28 shows the result of compiling the program 101 in FIG. 26 without using the user-defined instruction group U. The assembly list in FIG. 28 is called 'assembly list A<empty>' here. The instructions used for assembly codes in the assembly list A<empty> are only core instructions generally available for processors.

On the other hand, FIG. 29 shows the results of assembling using the user-defined instruction group U in FIG. 27. The assembly list in FIG. 29 is called 'assembly list A<muldivi, muldiv2>' here. Comparison of the assembly list A<empty> with the assembly list A<muldivi, muldiv2> reveals that:

lines 3 to 5 in the assembly list A<empty> have been replaced with an instruction 'muldivi'; lines 11 to 12 have been replaced with 'muldiv2'; and the number of instructions in the codes has thus decreased. It is also revealed that the number of to-be-executed instructions must decrease because the number of instructions has decreased.

Afterwards, the instruction set generation unit 2504 searches for an instruction subset U_x that satisfies the constraints 110 and has a minimum number of instructions. Here, a constraint such as 'the number of executable instructions is limited to 66 or less' is given as the constraints 110.

The number of executed instructions is calculated by finding the sum of products of the execution count for each basic block times the number of instructions in FIG. 28, revealing that the number of executed instructions included in the assembly list A<empty> is 71, which does not satisfy the constraints 110. Moreover, the number of executed instructions is calculated by finding the sum of products of the execution count for each basic block times the number of instructions in FIG. 29, revealing that the number of executed instructions included in the assembly list A<muldivi, muldiv2> is 62. This makes it clear that usage of the instructions 'muldiv2' and 'muldivi' satisfies the constraints 110.

Afterwards, the instruction set generation unit 2504 searches for a set having a minimum number of user-defined instructions. The procedure includes a given process that is repetitively executed while the constraints 110 are satisfied; where the process includes the steps of finding an instruction subset having the number of user-defined instructions reduced by one from the inputted entire set U_all and generating corresponding assembly codes.

There are three candidates for the set:
U={muldiv2, muldivi};
U_I={muldivi}; and
U_2={muldiv2}

According to a more specific procedure, firstly, the instruction set generation unit 2504 derives through instruction conversion an assembly code A<muldivi> corresponding to the instruction subset U_I and an assembly code A<muldiv2> corresponding to the user-defined instruction group U_2, and then determines whether or not each set satisfies the constraints 110.

FIG. 30 shows the assembly code A<muldivi> derivation results. FIG. 30 discloses that the number of executable instructions for the assembly code A<muldivi> is 69, which does not satisfy the constraints 110.

FIG. 31 shows the assembly code A<muldiv2> derivation results. FIG. 31 discloses that the number of executable instructions for the assembly code A<muldiv2> is 64, which means that the user-defined instruction group U_2 satisfies the constraints 110.

Lastly, the instruction set generation unit 2504 outputs the user-defined instruction group U_2 including the only instruction 'muldiv2' as an extended instruction set definition 2505, as exemplified in FIG. 32.

With the example described above, the only instruction set definition that satisfies the constraints 110 for the user-defined instruction group U_2 and has the minimum number of user-defined instructions is provided. However, depending on what are set to the constraints 110, multiple user-defined instruction groups may satisfy the conditions for the instruction set definitions. In the case of one of the constraints 110 being, for example, 'the number of executable instructions is 70 or less', both the user-defined instruction group U_I and user-defined instruction group U_2 satisfy that constraint. In this case, multiple instruction set definitions satisfying the condition may be output. Moreover, the order may be determined considering other conditions than what a user has designated, and outputting is made in conformity with the determined order. With the example described above, considering 'the number of instructions in the program 101' not designated by the user, since there are 15 instructions for the assembly code A<muldivi> corresponding to the user-defined instruction group U_I while there are 16 instructions for the assembly code A<muldiv2> corresponding to the user-defined instruction group U_2, the user-defined instruction group U_I takes priority over the user-defined instruction group U_2, and is then output.

Second Example

With the first example, the case of using 'the number of executed instructions in a program' and 'the number of instructions in a program' as the constraints 110 is explained; however, a case of using other constraints 110 is explained with the second example.

'Code size' as one of the constraints 110 can be determined based on the size of an object module output as the result of assembling the program 101 using a defined instruction set.

Several methods may be considered for calculating 'chip size' as one of the constraints 110. According to one method, roughly estimated chip sizes for respective user-defined instructions are provided as constraints 110 by a user, and the sum thereof is given to be the chip size for a defined instruction set. Alternatively, according to a method as an application thereof, chip sizes are given for respective combinations of multiple user-defined instructions, and the sum thereof is given to be the chip size for a defined instruction set. This method is effective for the case of a single computing unit being shared by multiple user-defined instructions. Since both of the instructions 'muldivi' and 'muldiv2', for example, need a multiplier and a divider, both of these instructions are considered to share them. According to a further alternative method, a circuit for each defined instruction set is developed for using external tools such as a high-level synthesis tool, and chip size is estimated based thereon.

Third Example

Figure 33:
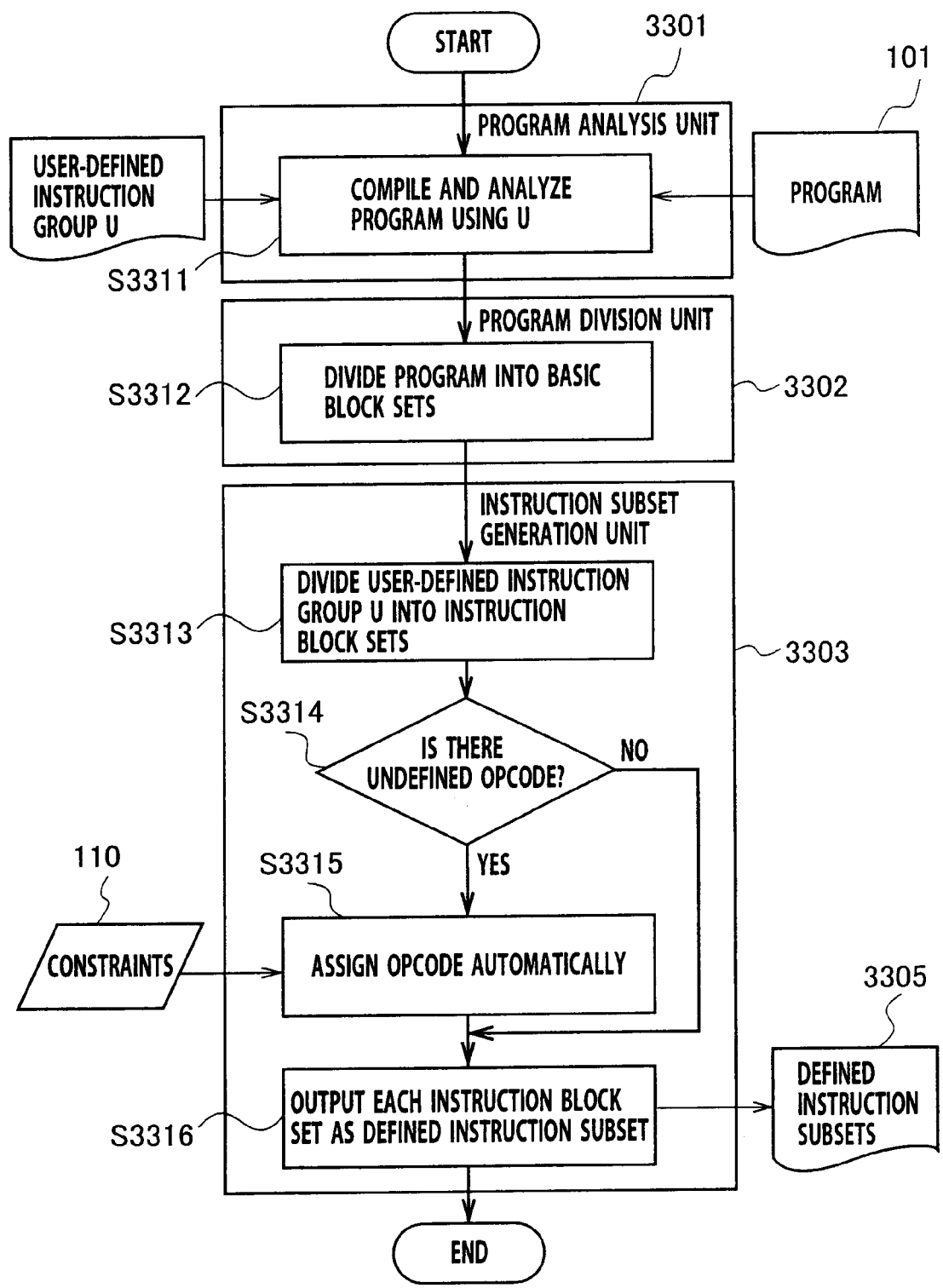
FIG. 33 shows an exemplary configuration of a design apparatus according to the fourth embodiment (third example)

FIG. 33 shows an exemplary configuration of a design apparatus according to the third example of the fourth embodiment. This design apparatus operates with the following procedure. It is different from the procedure for the first example in that the instruction set generation unit 2504 is replaced with a program division unit 3302 and an instruction subset definition unit 3303, and that undefined opcodes may be included in the inputted instruction opcodes in the user-defined instruction group U.

Firstly, a user provides the design apparatus a program 101, which is to be executed by a processor, and a user-defined instruction group U. Undefined opcodes maybe included in instructions of the user-defined instruction group U.

In step S3311, the program analysis unit 3301 compiles the program 101 and generates assembly codes and object codes using provided the user-defined instruction group U. The program analysis unit 3301 also records the frequency of occurrence of each user-defined instruction in each basic block. Moreover, the program analysis unit 3301 records the execution count for each basic block based on the profile information obtained by the simulator.

In step S3312, the program division unit 3302 puts together basic blocks that employ the same user-defined instruction group U, with a basic block as a unit. Those basic blocks that employ the same user-defined instruction group are called 'a set of instruction blocks'.

In step S3313, the instruction subset generation unit 3303 outputs as a defined instruction subset, the user-defined instruction group being used for each set of instruction blocks generated in step S3312. At this time, if the constraints 110 are given, instruction conversion is carried out with the same procedure as that of step S2516 according to the first example before outputting the defined instruction set, thereby reducing the number of user-defined instructions to be used.

In step S3314, the instruction subset generation unit 3303 determines whether or not there is an undefined opcode in instructions of the user-defined instruction group U, and if yes, an opcode is selected from an available range and assigned thereto in step S3315. The instruction subset generation unit 3303 then outputs each set of instruction blocks as a defined instruction subset 3305 in step S3316.

A more specific example is disclosed forthwith. Here, a case of providing a C language program 101 as shown in FIG. 34 and a user-defined instruction group Umax as shown in FIG. 35 is considered. As shown in FIG. 35, three instructions 'muldivi', 'max3', and 'min3' are defined in the user-defined instruction group Umax. These are different from those in the user-defined instruction group shown in FIG. 27 in that symbol '*' is designated for opcodes. Each opcode is a bit pattern of an instruction; where a single bit is represented by a single character, and '0' and '1' denote bit values. 'n', 'm', and 'k' denote the register numbers for register operands Rn, Rm, and Rk, respectively. They are numbers obtained by encoding the values of the register numbers specified in operands of assembly codes. Note that '_' is a mere delimiter, and is thus neglected as data. '*' denotes an undefined item in the opcode in an instruction.

FIG. 36 shows an assembly list A<muldiv2, muldivi, max3, min3>, which is the result of assembling the program 101 in FIG. 34 by the program analysis unit 3301 using the user-defined instruction group Umax.

The program division unit 3302 divides the basic blocks 1 through 4 into sets of instruction blocks using the assembly list A<muldiv2, max3, min3>. Many division methods can be considered to be used for the operation; however, for simplicity, blocks using the same user-defined instruction are put together here, and the results are shown in FIG. 37.

Afterwards, the instruction subset generation unit 3303 generates a defined instruction subset corresponding to each set of instruction blocks. Consequently, a defined instruction subset for a set of instruction blocks IB1 is a defined instruction subset U_IB1={muldiv2}, while a defined instruction subset for a set of instruction blocks IB2 is a defined instruction subset U_IB2={min3, max3}. Since a user-defined instruction is not used for a set of instruction blocks IB3, no defined instruction subset is output.

Moreover, since there is an undefined opcode in the user-defined instruction group Umax, the instruction subset generation unit 3303 determines an opcode to be assigned. It is assumed here that an available opcode range to be the constraints 110 is given as an input. It is also assumed that 'lower five bits are available' is designated as an available opcode range.

As shown in FIG. 38, the fifth through eighth bits from the LSB of the opcode in each instruction are marked with '*' or undefined; however, since an available range is only between the first and fifth bit, the assignment for only the fifth bit is changeable. Since only two opcodes can be designated by changing one bit, the three instructions: 'muldiv2', 'max3', and 'min3' cannot be assigned simultaneously. Therefore, the same opcode range is assigned to the defined instruction subsets U_IB1 and U_IB2. Since the number of user-defined instructions for each instruction subset is two or less, that assignment allows all instructions to have opcodes.

FIG. 39 shows the results of that assignment of opcodes. That assignment of opcodes to instructions may be directly designated by a user, or it may be automatically made by the instruction subset generation unit 3303.

In the case of an example shown in FIG. 39, since instructions 'muldiv2' and 'max3' may be assigned the same opcode, both of them cannot be used at the same time, and the defined instruction subset needs to be changed by a certain means. It is considered that the changing method may be a method of using dedicated instructions or a method of setting certain values to specific control registers.

FIG. 40 shows an example of a method of inserting a dedicated instruction 'switchiss' at the beginning of each basic block and changing over. Implementation of multiple defined instruction subsets in the same hardware, change over, and execution allows use of such instruction subsets. These defined instruction subsets may be implemented in a dynamically re-configurable circuit, for example.

As described above, according to the fourth embodiment, provision of user's requests as constraints 110 makes automatically finding instruction sets that satisfy those requests and also automatically assigning undefined opcodes possible. Moreover, assignment of multiple defined instruction subsets to the same hardware allows execution of necessary user-defined instructions and reduction of the chip size thereof.

Fifth Embodiment

With the fifth embodiment, a library optimizer, which optimizes a library to be used for compilation or the like of the program 101 based on the defined extended instructions for a configurable processor, is described.

As exemplified in FIG. 41, the library optimizer includes an analysis unit 4101, a detection unit 4104, a conversion unit 4107, and related units. The analysis unit 4101 analyzes an instruction sequence for a processor corresponding to each defined extended instruction in the extended instruction definition file 113. The detection unit 4104 determines whether or not there is said instruction sequence in the library 112a binary codes based on the results (corresponding table 4102) of analysis by the analysis unit 4101. The binary conversion unit 4107 optimizes the library 112a binary codes based on the detection results 4105 from the detection unit 4104.

An exemplary operation of each unit described above is detailed forthwith.

Figure 42:
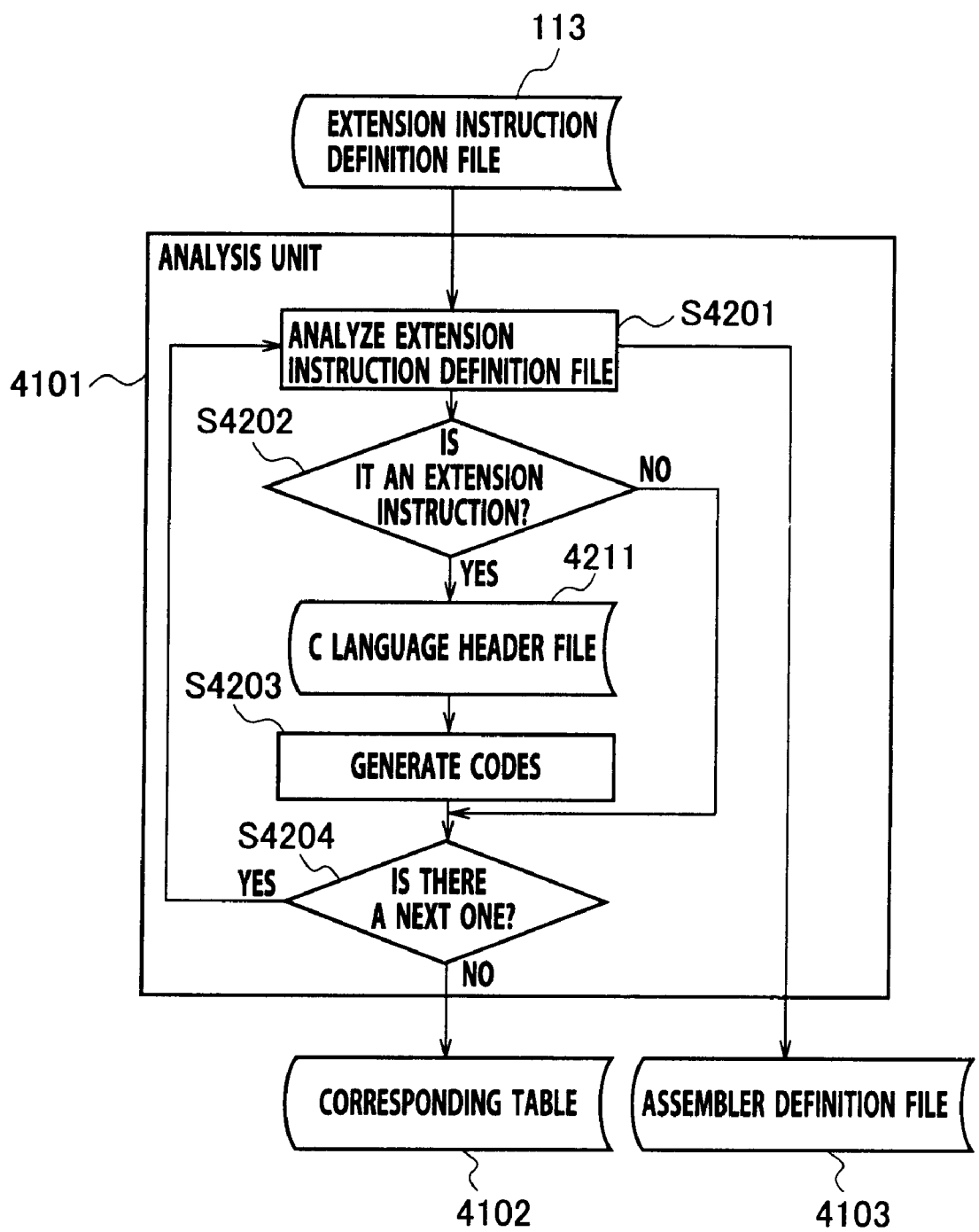
FIG. 42 shows an exemplary detailed configuration of an analysis unit in the library optimizer shown in FIG. 41.

FIG. 42 shows an exemplary operation of the analysis unit 4101.

As shown in FIG. 42, the analysis unit 4101 inputs the extended instruction definition file 113 and then analyzes defined extended instructions (step S4201). The extended instruction definition file 113 may be a file generated by the design apparatus according to each embodiment described above, or a file manually made. It is assumed here that the extended instruction definition file 113 includes all defined instructions for a target processor.

The analysis unit 4101 also converts the inputted, extended instruction definition file 113 to an assembler definition file 4103 to be internally used and a C language header file 4211 or internal information equivalent to the C language header file 4211. Alternatively, the analysis unit 4101 may input from the outside, the assembler definition file 4103 and the C language header file 4211 either manually or automatically generated.

If the results of analysis in step S4201 reveal that it is an extended instruction, the analysis unit 4101 then analyzes an instruction sequence for a target processor equivalent to that extended instruction from the C language header file 4211 (step S4203). This operation uses the 'Optimization Method Used by Compiler' described with the second embodiment. Note that the analysis unit 4101 analyzes assembly codes other than intermediate codes.

If there is a defined instruction left in the extended instruction definition file 113, this procedure returns to step S4201, and the above mentioned process is repetitively executed until the process for all the defined instructions in the extended instruction definition file 113 has ended (step S4204).

As a result, the corresponding table 4102 showing extended instructions corresponding to respective instruction sequences for a target processor, each being able to be replaced with corresponding extended instruction, is generated as the analysis results.

At this time, only the analysis results allowing reduction of the code size are effective because there is no meaning to optimization in the case of the code size being unchanged or increased and because they are needed for local binary conversion by the conversion unit 4107. Code size information is derived from the assembler definition file 4103.

Figure 43:
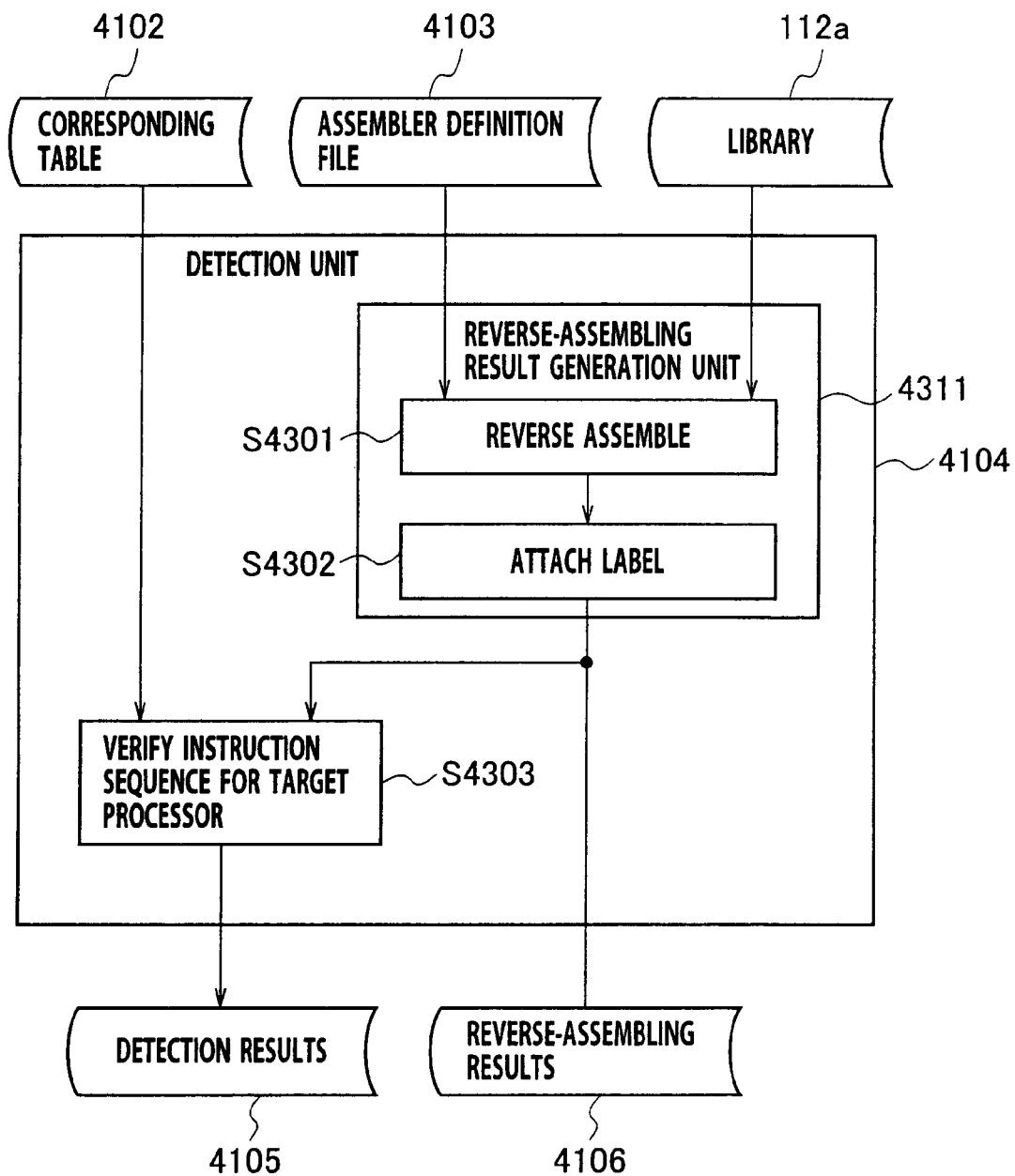
FIG. 43 shows an exemplary detailed configuration of a detection unit in the library optimizer shown in FIG. 41.

FIG. 43 shows an exemplary operation of the detection unit 4104.

As shown in FIG. 43, the detection unit 4104 searches each library 112a for an instruction sequence possible to be converted to an extended instruction. Alternatively, all libraries may be a target in place of the library 112a, or inputting profile information from the outside by a certain means and limiting the range of the library 112a to be optimized and/or limiting the internal range thereof to be optimized is possible. Limitation of the range to be searched allows high-speed execution of the detection process and the conversion process. Since each library 112a is scanned in either case, the following explanation is made under a premise that searching and converting are carried out for the independent library 112a. A library to be subjected to detection and conversion is called a 'target library'. It is assumed here that this target library is the library 112a written in C. However, other languages are also accepted as long as certain conditions are satisfied. Details thereof are explained later.

A reverse-assembling result generation unit 4311 provides the results 4106 of reverse assembling the target library using the assembler definition file 4103 (step S4301). The reverse-assembling result generation unit 4311 searches the reverse-assembling results for an instruction sequence equivalent to an extended instruction using the corresponding table 4102 generated by the analysis unit 4101, and then outputs it as the searching results 4105 (step S4303). The method of searching an instruction sequence equivalent to an extended instruction uses the 'Optimization Method Used by Compiler' described with the second embodiment.

The process of searching an instruction sequence equivalent to an extended instruction in step S4303 cannot include converging instructions. Considering this, the reverse-assembling result generation unit 4311 attaches a certain label to converging instructions when reverse-assembling (step S4302). This allows avoidance of detecting an instruction sequence including that label as a candidate for an instruction sequence that can be replaced with an extended instruction.

The reverse-assembling result generation unit 4311 attaches that label in the following procedure.

(1) Attaches a certain label to the next instruction to an unconditional branch instruction when reverse-assembling;

(2) Calculates offset values for branch instructions in a PC-relative addressing mode in the entire target library and attaches a certain label thereto; and (3) Searches relocation information in the target library for branch instructions in an absolute addressing mode, and attaches a certain label thereto.

As a result, in the case of the target library being written in C, all converging instructions included in the target library have been successfully attached with labels. In the case of global symbols being referenced from other libraries or other modules, they definitely appear at the beginning of functions, and there is always an unconditional branch instruction just before each of them. In the case of the instruction just before the beginning instruction in a function not being an unconditional branch instruction with a compiler generating the target library in C language, it is technically possible to always change it to an unconditional branch instruction through use of compiler options or implementation of a corresponding process thereto in the compiler. In the case where convergence happens due to operations in a pointer addressing mode, it should be limited to being at the beginning of a function as long as it is included in libraries written in C, and it can be detected in the way as described above.

Figure 44:
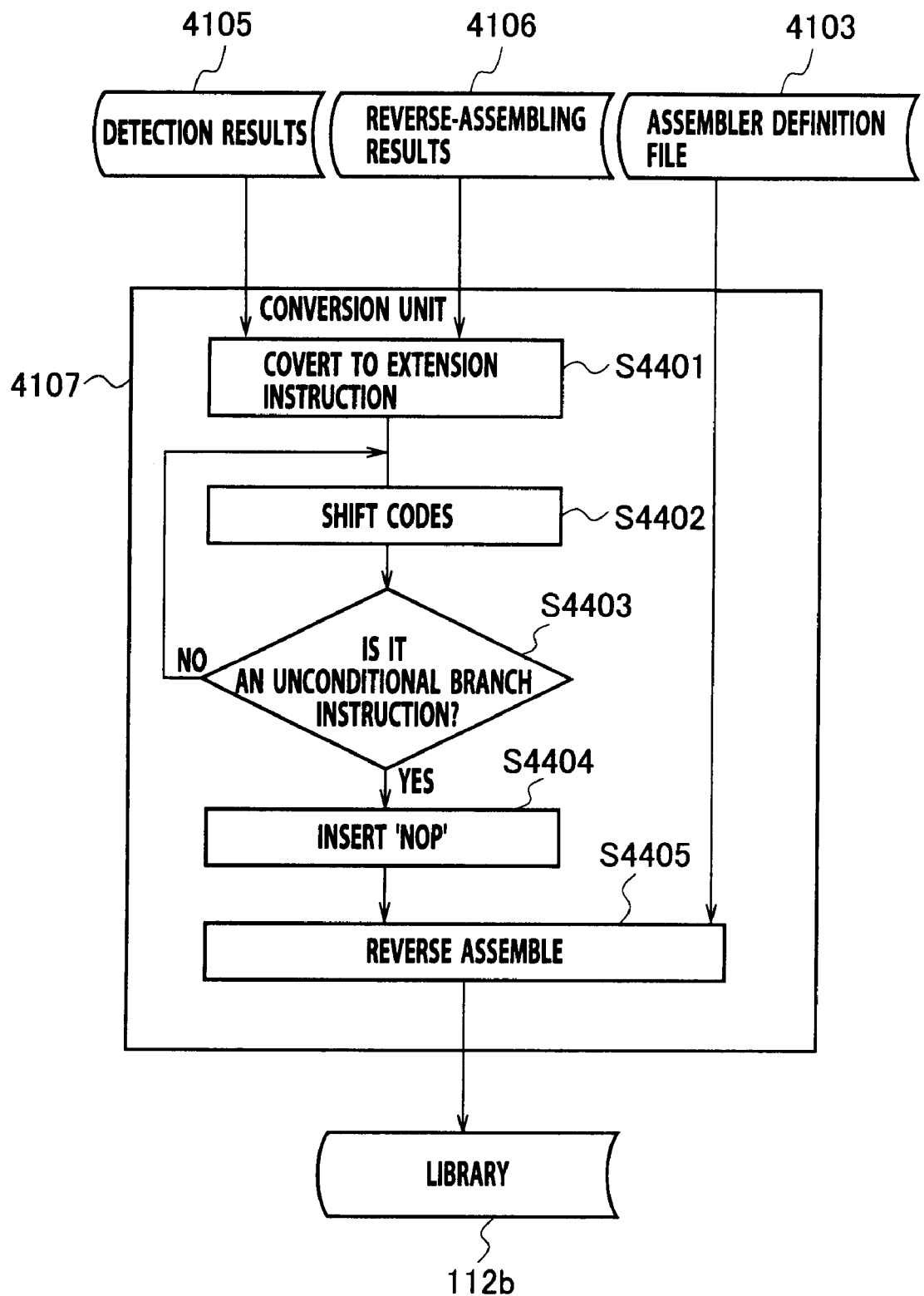
FIG. 44 shows an exemplary detailed configuration of a conversion unit in the library optimizer shown in FIG. 41.

FIG. 44 shows an exemplary operation of the conversion unit 4107.

As shown in FIG. 44, the conversion unit 4107 optimizes and converts the binary codes in the library 112a based on the results 4105 of detection by the detection unit 4104.

The conversion unit 4107 deletes all applicable instruction sequences, converts to corresponding extended instruction binary codes, and puts them in the lowest address (step S4401). After conversion, vacant regions are left as gaps.

Afterwards, the conversion unit 4107 shifts and fills the instructions after an applicable instruction sequence in corresponding gap (step S4402). At this time, the conversion unit 4107 carries out the following operation.

(1) In the case of an instruction to be shifted having been attached with a label, offset values for PC-relative addressing mode branch instructions included in the entire target library, each allowing branching to that label but not being shifted, are corrected based on the shifting distance of that instruction with the label, while for direct addressing mode branch instructions, relocation information is corrected accordingly;

(2) In the case of an instruction to be shifted being a PC-relative addressing mode branch instruction, if a branching-target instruction is not shifted, the offset value for that branch instruction is corrected based on the shifting distance;

(3) In the case of an instruction to be shifted being a direct addressing mode branch instruction, relocation information is corrected accordingly; and (4) In the case of an instruction to be shifted being an unconditional branch instruction (including a return instruction), the same correction as in the case (2) or case (3) is made, that instruction is then shifted, and shifting ends. On the other hand, if that instruction to be shifted is not an unconditional branch instruction, subsequent instructions are shifted in order (step S4403).

As described above, since the aforementioned operation ends after the unconditional branch instruction has been shifted, the conversion process can be carried out at a high speed. Moreover, a newly developed gap after shifting ends may be left as is, or may be filled with an instruction 'nop', allowing reformed display of the reverse-assembling results provided when debugging.

Lastly, the conversion unit 4107 reassembles the target library and outputs an optimized library 112b.

Next, a working example using a function 'atoi' in a standard library is explained. The function 'atoi' to be used here is not quite a perfect function; however, it is sufficient as a working example. It is assumed that programming is carried out using C language as shown in FIG. 45 and the binary codes for that C language program are provided as a library. Note that 'rrrrrr' in line 4501 of FIG. 46 denotes relocation information.

It is assumed here that a definition of extended instructions as shown in FIG. 47 is given. This definition of extended instructions may be automatically or manually generated. The library optimizer may directly input the aforementioned file, or may input an assembler definition file and a C language header file generated by a specific means as shown in FIG. 48.

The analysis unit 4101 analyzes an instruction sequence for a target processor equivalent to a defined, extended instruction from the C language header file. The 'Optimization Method Used by Compiler' technique described in the second embodiment is used for this analysis.

Namely, the analysis results (corresponding table 4102) revealing that an instruction sequence:

'slad3 $t, $n, $n';
'mov $u, $t';

'add3 $t, $m, −48';
'sll $u, 1'; and

'add3 $n, $t, $u' can be converted to an extended instruction 'digit $n, $u' are provided.

The detection unit 4104 generates the reverse-assembling results 4106 for the above-mentioned binary codes. The reverse-assembling results:

'$_{13}$ atoi';
'L50000'; and
'L5' are labels that can be detected satisfying the conditions detailed above, and are recognized as labels by the detection unit 4104.

The detection unit 4104 detects, based on the analysis results, an instruction sequence that can be converted to an instruction 'digit' from those reverse-assembling results 4106. The 'Optimization Method Used by Compiler' technique described in the second embodiment is used for this analysis.

As a result, the detection results 4105 revealing that an instruction sequence:

'slad3 $0, $0, $0';
'mov $12, $0';

'add3 $0, $11, −48';
'sll $12, 1'; and

'add3 $0, $0, $12' can be converted to an extended instruction 'digit $0, $11' are output.

The conversion unit 4107 has the detected sequence of codes as a gap, and converts the top of the gap to an extended instruction. At this time, the target library shown in FIG. 49 is provided. The unprocessed gap (lines 4811 and 4813) is shown with 'xxxx'.

Afterwards, the conversion unit 4107 starts shifting for filling the gap. To delete 'xxxx' indicating the gap, the instruction sequence just after the gap is shifted. Since a label 'L5' (line 4815) is shifted, the binary codes for an instruction (instruction 'beqz' (line 4809)) using an offset pointing at that label are also converted. Moreover, since a PC-relative addressing mode branch instruction (instruction 'bra' (line 4814)) is also shifted, the binary codes thereof are converted. Since an instruction 'ret' (line 4816) is an unconditional branch instruction, shifting ends at the time when it has been shifted. The shifting results are shown in FIG. 50.

A newly developed gap (lines 4914 to 4917) may be left as is; however, as shown in FIG. 51, it is filled with an instruction 'nop' so as to enhance the appearance of the reverse-assembling results provided during debugging.

As described above, according to the fifth embodiment, a library linked to an application program may be optimized using extended instructions, allowing generation of a high-speed executable object file.

While the embodiments according to the present invention have been detailed, the present invention can be implemented with a variety of configurations without deviating from the spirit and the main characteristics of the present invention.

Therefore, since each embodiment described above is a mere example from every aspect, the scope of the present invention should not be interpreted in a restricted manner. The scope of the present invention is defined by the claims, and is not limited by the contents of the specification according to the present invention. Moreover, all modifications and/or changes belonging to items within the scope of the claims or equivalents thereto have to fall within the scope of the present invention.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A design apparatus for designing a configurable processor for an application, comprising:

an analysis unit configured to analyze content of a program to be executed by the configurable processor statically and dynamically in order to output static analysis information as a performance of the target configurable processor using syntax analysis information obtained from program compiled results and dynamic analysis information using profile information generated by a simulation; and an extension instruction definition unit configured to search the program for a part of the program allowing use of an extension instruction by determining whether the performance of the target configurable processor reaches a predetermined target performance by comparing the performance of the target configurable processor with the predetermined target performance of the target configurable processor in accordance with analysis results output by the analysis unit, and to generate a definition of the extension instruction for at least one of the searched part and a user-given part allowing use of the extension instruction by optimizing the instructions described in the program for carrying out a same operation as the program of an extended instruction into a machine language script corresponding to the extended instruction, and the extension instruction definition unit comprising, an extension instruction use determination unit, which determines whether to generate for an extension instruction use candidate block in the program, an extension instruction for a processing equivalent to processing for that block, and an instruction description generation unit, which generates an extension instruction description, which is generated as an instruction set of the configurable processor, for a processing equivalent to processing for that block in accordance with the determination results by the extension instruction use determination unit when the performance of the target configurable processor reaches the predetermined target performance.

2. The design apparatus according to claim 1, wherein the extension instruction definition unit comprises:

a block division unit that further divides each block so that each statement in the block can comprise at least one further divided block, and the instruction description generation unit generates an extension instruction description for at least one of the further divided blocks.

3. The design apparatus according to claim 2, wherein the block division unit divides a single statement described in the program into a plurality of blocks.

4. The design apparatus according to claim 2, wherein the instruction description generation unit generates, from each of divided and generated blocks, an extension instruction description for at least one of a statement that uses a predetermined variable and a block including an instruction sequence that uses a predetermined register.

5. The design apparatus according to claim 1, wherein the instruction description generation unit assigns a variable used in the block to an external register of the processor and generates an extension instruction description that defines a transfer instruction for transferring data between the assigned external register and the processor.

6. A computer-aided design method of designing a configurable processor for an application, comprising:

analyzing content of a program to be executed by the configurable processor statically and dynamically in order to output static analysis information as a performance of the target configurable processor using syntax analysis information obtained from program compiled results and dynamic analysis information using profile information generated by a simulation;

determining whether to generate an extension instruction for an extension instruction use candidate block in the program by determining whether the performance of the target configurable processor reaches a predetermined target performance by comparing the performance of the target processor with the predetermined target performance, the extension instruction processes equivalent to processing for that block in accordance with the determination results; and generating an extension instruction description, which is generated as an instruction set of the configurable processor, for a processing equivalent to processing for that block in accordance with the determination results by optimizing the instructions described in the program for carrying out a same operation as the program of an extended instruction into a machine language script corresponding to the extended instruction when the performance of a target configurable processor reaches the predetermined target performance.

* * * * *